(12) United States Patent
Shiozawa

(10) Patent No.: US 6,391,686 B1
(45) Date of Patent: May 21, 2002

(54) ADHESIVE MATERIAL APPLYING METHOD AND APPARATUS, INTERCONNECT SUBSTRATE, SEMICONDUCTOR DEVICE AND MANUFACTURING METHOD THEREOF, CIRCUIT BOARD AND ELECTRONIC INSTRUMENT

(75) Inventor: Masakuni Shiozawa, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/592,292

(22) Filed: Jun. 12, 2000

(30) Foreign Application Priority Data

Jun. 14, 1999 (JP) .......................................... 11-166941
May 15, 2000 (JP) ....................................... 2000-141198

(51) Int. Cl.[7] ......................... H01L 21/44; H01L 21/48; H01L 21/50

(52) U.S. Cl. ...................................... 438/118; 438/119

(58) Field of Search .................................. 438/118, 119

(56) References Cited

U.S. PATENT DOCUMENTS

| 5,221,642 A | * | 6/1993 | Burns |
| 5,846,851 A | * | 12/1998 | Sasaki et al. |
| 6,030,711 A | * | 2/2000 | Evers |
| 6,159,609 A | * | 12/2000 | Evers |
| 6,224,711 B1 | * | 5/2001 | Carden et al. |
| 6,268,646 B1 | * | 7/2001 | Sugimoto et al. |

FOREIGN PATENT DOCUMENTS

| JP | A-6-5735 | 1/1994 |
| JP | A-10-335384 | 12/1998 |

* cited by examiner

Primary Examiner—John F. Niebling
Assistant Examiner—Josetta I. Jones
(74) Attorney, Agent, or Firm—Oliff & Berridge, PLC

(57) ABSTRACT

A method of applying an adhesive material comprising the steps of: providing the adhesive material on an interconnect substrate; and pressure-bonding the adhesive material to the interconnect substrate. A base has a plurality of first regions to be punched out and second regions located between the first regions. An interconnect pattern is formed at least in the first regions. Part of the adhesive material located within the first regions is pressurized to flow toward the second regions to move air bubbles to the second regions.

14 Claims, 21 Drawing Sheets

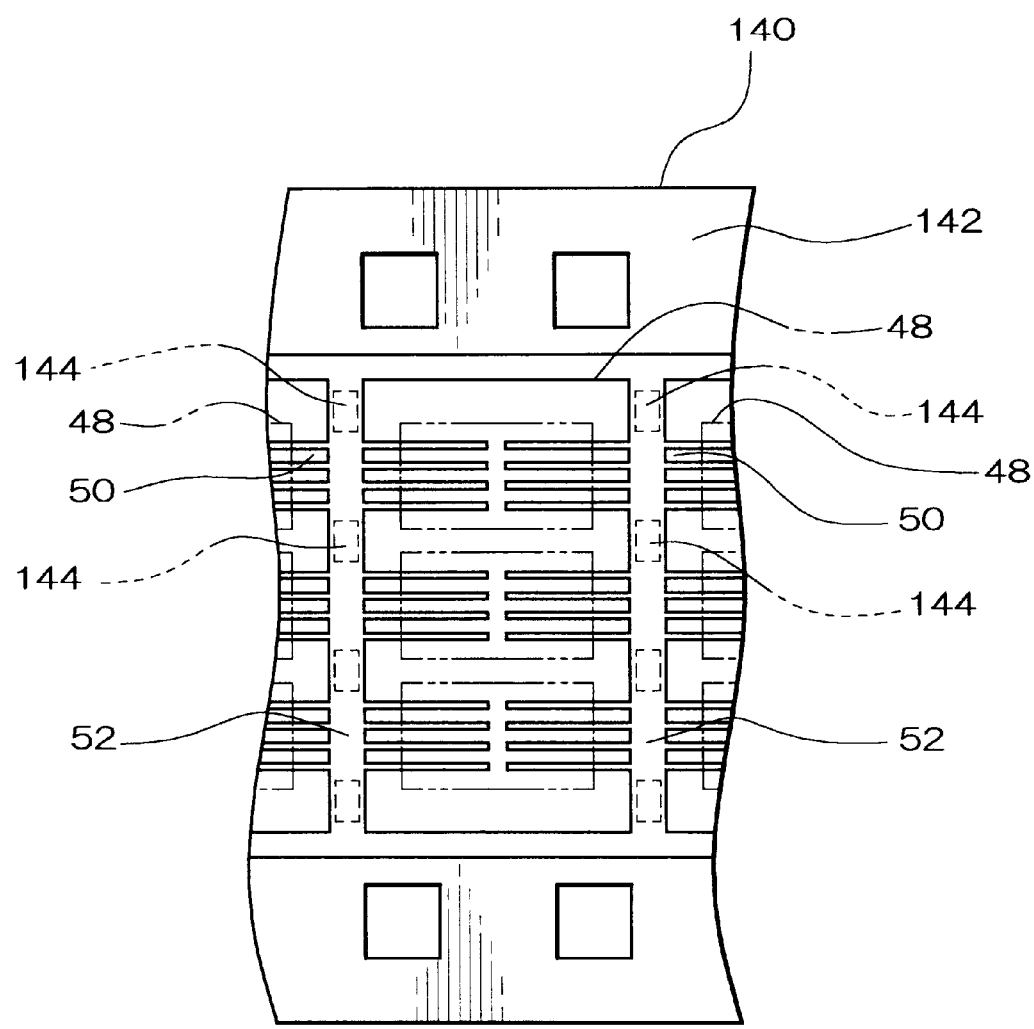
F I G. 19

ADHESIVE MATERIAL APPLYING METHOD AND APPARATUS, INTERCONNECT SUBSTRATE, SEMICONDUCTOR DEVICE AND MANUFACTURING METHOD THEREOF, CIRCUIT BOARD AND ELECTRONIC INSTRUMENT

BACKGROUND OF THE INVENTION

1. Field of the Invention

The present invention relates to an adhesive material applying method and apparatus, interconnect substrate, semiconductor device and method of its production, circuit board and electronic instrument.

2. Description of Related Art

Recently, there is being used an anisotropic conductive film (ACF) when semiconductor chips are to be electrically connected to an interconnect pattern on a package substrate in a process of assembling a semiconductor device to which ball grid array (BGA) or chip scale/size package (CSP) is applied.

Such an anisotropic conductive film is formed by forming an adhesive containing dispersed conductive particles such as Ni, Au, Cu on a base film. The semiconductor chip is adhered to the package substrate through the conductive particles so that the semiconductor chips will electrically be connected to the interconnect pattern.

The anisotropic conductive film applied according to the prior art process may contain air bubbles at the corners between the interconnect pattern and the package substrate. Air bubbles may burst in the subsequent step such as a temporary pressurizing step (for about ten seconds at a relatively low temperature of about 100° C.) or a main pressurizing step (for about 15 seconds at about 220° C.). This raises a problem in that the anisotropic conductive film is separated from the package substrate.

SUMMARY OF THE INVENTION

To overcome such a problem, an objective of the present invention is to provide an adhesive material applying method and apparatus, interconnect substrate, semiconductor device and manufacturing method thereof, circuit board and electronic instrument which can remove air bubbles.

(1) According to a first aspect of the present invention, there is provided a method of applying an adhesive material, comprising the steps of: providing an adhesive material on an interconnect substrate which has a base and an interconnect pattern formed on the base; and pressure-bonding the adhesive material onto the interconnect substrate, wherein the base has a plurality of first regions to be punched out and second regions located between the first regions adjacent to one another;

wherein the interconnect pattern is formed at least in the first regions of the base; and wherein part of the adhesive material provided in the first regions is pressurized to flow toward the second regions, so that air bubbles formed at corners between the base and the interconnect pattern in the first regions are moved to the second regions.

According to this aspect of the present invention, air bubbles are formed at the corners between the base and the interconnect pattern in the first regions when providing the adhesive material to the interconnect substrate since it is difficult to completely fill the corners with the adhesive material. However, part of the adhesive material including air bubbles in the first regions is moved to the second regions, when the adhesive material is pressure-bonded onto the interconnect substrate. Since the amount of air bubbles in the first regions can be reduced, products having such interconnect substrates can be provided with a reduced probability of failure. This improves the productivity and yield. The presence of air bubbles in the second regions will not raise any problem since the second regions have been left after the first regions have been punched out.

(2) In the method of applying an adhesive material, through-holes may be formed in the second regions of the base of the interconnect substrate; and the adhesive material may be pressurized to flow into the through-holes.

Thus, the air bubbles in the first regions are moved to the second regions when the adhesive material flows into the through-holes in the second regions.

(3) In the method of applying an adhesive material, the interconnect pattern may include leads formed in the second regions; and the through-holes may penetrate the leads and the base.

Thus, the air bubbles in the first regions are moved when the adhesive material flows through the through-holes formed in the leads in the second regions.

(4) In the method of applying an adhesive material, the interconnect pattern may include leads formed in the second regions; and the through-holes may be formed adjacent to the leads.

Since the through-holes are formed adjacent to the leads, the adhesive material and the air bubbles can be easily moved without being obstructed by the leads.

(5) In the method of applying an adhesive material, the interconnect substrate may include depressions formed within the second regions on a surface of the base opposite to another surface of the base on which the interconnect pattern is formed; and the surface having the interconnect pattern is dented toward the depressions so that the adhesive material flows when the adhesive material is pressurized.

In this way, the surface of the base on which the interconnect pattern is formed can be dented toward the other surface of the base on which the depressions are formed so that the adhesive material flows toward the dent and the air bubbles moves to the second regions.

(6) In the method of applying an adhesive material, the interconnect pattern may include leads formed in the second regions; and the depressions may be formed below the leads.

Thus, the base can be dented toward the depressions through the leads. Since the adhesive material can flow toward the dent, the air bubbles can also be moved to the second regions.

(7) In the method of applying an adhesive material, a pressurizing jig may be used to pressure-bond the adhesive material onto the interconnect substrate; the pressurizing jig may be formed with depressions at positions corresponding to the second regions of the base; and the adhesive material may be pressurized to flow toward the depressions.

Thus, the adhesive material will be moved, together with air bubbles, toward the depressions in the pressurizing jig.

(8) In the method of applying an adhesive material, the interconnect substrate may be placed on a stand so that the adhesive material is pressure-bonded to the interconnect pattern; the stand may have depressions at positions corresponding to the second regions of the base; and when the adhesive material is pressurized, the surface of the base on which the interconnect pattern is formed may be dented toward the depressions so that the adhesive material flows.

Thus, the adhesive material can be moved, together with the air bubbles, toward the depressions in the stand.

(9) In the method of applying an adhesive material, spaces may be formed in the adhesive material at positions above the second regions of the base so that the adhesive material flows into the spaces later.

Thus, the adhesive material in the first regions will be moved, together with the air bubbles, into the spaces above the second regions.

(10) In the method of applying an adhesive material, the interconnect pattern may include leads formed in the second regions; and the magnitude of each of the spaces may be larger than each of the leads.

Thus, the adhesive material and the air bubbles can easily move without being obstructed by the leads.

(11) In the method of applying an adhesive material, the first regions may be arranged in plural rows and columns.

(12) In the method of applying an adhesive material, the adhesive material may be provided in a form of a film to be pressure-bonded to the interconnect substrate.

(13) In the method of applying an adhesive material, the adhesive material may be provided in a form of a liquid to be pressure-bonded to the interconnect substrate.

(14) According to a second aspect of the present invention, there is provided a method of manufacturing a semiconductor device, comprising the steps of:
  applying the adhesive material to the interconnect substrate by the method of applying an adhesive material as defined in claim 1;
  bonding semiconductor chips to the respective first regions through the adhesive material; and
  punching out the interconnect substrate at each of the first regions.

According to this aspect of the present invention, since a semiconductor device to be produced includes only the first regions having reduced air bubbles, the products can be provided with a reduced probability of failure, improving the productivity and yield.

(15) According to a third aspect of the present invention, there is provided an interconnect substrate comprising:
  a base;
  an interconnect pattern formed on the base; and
  a adhesive material bonded to the base and interconnect pattern,
  wherein the base has a plurality of first regions to be punched out and second regions located between the first regions adjacent to one another;
  wherein the interconnect pattern is formed at least in the first regions of the base; and
  wherein air bubbles formed between the base and the interconnect pattern in the first regions are moved to the second regions.

According to this aspect of the present invention, since the amount of air bubbles is reduced in the first regions, the products having such interconnect substrates can be provided with a reduced probability of failure, improving the productivity and yield. On the other hand, the presence of air bubbles in the second regions will not raise any problem since the second regions have been left after the first regions have been punched out.

(16) In the interconnect substrate, through-holes may be formed in the second regions of the base; and part of the adhesive material may flow into the through-holes.

Flowing of part of the adhesive material into the through-holes in the second regions proves movement of the air bubbles from the first regions to the second regions.

(17) In the interconnect substrate, the interconnect pattern may include leads formed in the second regions; and the through-holes may penetrate the leads and the base.

Thus, part of the adhesive material can flow into the through-holes in the leads and the base.

(18) In the interconnect substrate, the interconnect pattern may include leads formed in the second regions; and the through-holes may be formed adjacent to the leads.

Thus, the adhesive material and the air bubbles can be easily moved without being obstructed by the leads.

(19) In the interconnect substrate, depressions may be formed within the second regions on a surface of the base opposite to another surface of the base on which the interconnect pattern is formed.

Due to the depressions, the surface of the base opposite to the surface thereof on which the depressions are formed can be easily dented so that the adhesive material can flow toward the dent. Therefore, presence of the depressions in the interconnect substrate proves movement of the air bubbles from the first regions to the second regions.

(20) In the interconnect substrate, the interconnect pattern may include leads formed in the second regions; and the depressions may be formed below the leads.

Thus, the surface of the base opposite to the surface thereof on which the depressions are formed can be dented through the leads.

(21) According to a fourth aspect of the present invention, there is provided an apparatus of applying an adhesive material which has a pressurizing jig and a stand for pressure-bonding the adhesive material to an interconnect substrate having a base and an interconnect pattern formed on the base,
  wherein the base has a plurality of first regions to be punched out and second regions located between the first regions adjacent to one another;
  wherein the interconnect pattern is formed at least in the first regions of the base;
  wherein at least one of the pressurizing jig and the stand has depressions at positions corresponding to the second regions of the base; and
  wherein part of the adhesive material provided in the first regions is pressurized to flow toward the second regions so that air bubbles formed at corners between the base and the interconnect pattern are moved toward the depressions.

Thus, the adhesive material can be moved, together with the air bubbles, toward the depressions in the pressurizing jig or the stand.

(22) According to a fifth aspect of the present invention, there is provided a semiconductor device manufactured by the aforementioned method.

(23) According to a sixth aspect of the present invention, there is provided a circuit board to which aforementioned semiconductor device is electrically connected.

(24) According to a seventh aspect of the present invention, there is provided an electronic instrument having the aforementioned semiconductor device.

BRIEF DESCRIPTION OF THE DRAWINGS

FIG. 19 illustrates an eighth embodiment of the present invention.

DETAILED DESCRIPTION OF THE PREFERRED EMBODIMENTS

The present invention will now be described by way of example with reference to the drawings.

First Embodiment

Figure 1:
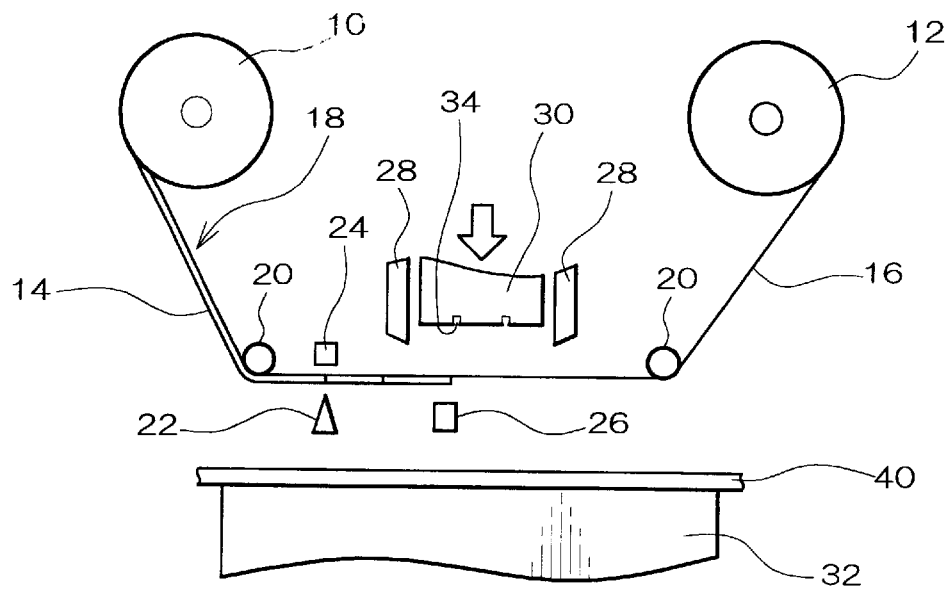
FIG. 1 illustrates a first embodiment of the present invention.

FIGS. 1–5 illustrate the first embodiment of the present invention which uses an applicator shown in FIG. 1.

(Applicator)

The applicator comprises a feed roller (reel) 10 and a winding roller (reel) 12, between which an adhesive sheet 18 runs. The adhesive sheet 18 consists of a tape-like base film (separator) 16 and an adhesive material 14 applied thereto. In an example of FIG. 1, the adhesive material 14 is an anisotropic conductive film (ACF) which is formed by an adhesive containing conductive particles dispersed therein. However, the present invention may use the adhesive material 14 in the form of a non-conductive film (NCF). As will be described later, the adhesive material 14 may be in the form of liquid or paste.

Below the feed and winding rollers 10, 12 are respectively located hold-down rollers 20. The adhesive sheet 18 is fed out from the feed roller 10 toward an object to be adhered (or interconnect substrate 40) with the adhesive material 14 being faced to the object to be adhered. A cutter 22 is located downstream adjacent to the hold-down roller 20 on the side of the feed roller 10 in the direction of movement of the adhesive sheet 18.

The cutter 22 is designed to be upward moved such that the adhesive sheet 14 will be cut from the underside thereof. The cutter 22 will not cut the base film (or separator) 16. To hold the base film 16 when the cutter 22 cuts the adhesive material 14, a cutter stop 24 is located above the run of the base film 16 at a position corresponding to the cutter 22.

Further downstream in the direction of movement of the adhesive sheet 18 is arranged a sensor 26 for sensing the leading edge of the cut adhesive material 14. The sensor 26 is located below the run of the adhesive material 14. A pressurizing jig 30 is arranged for vertical movement and located above the run of the base film 16 at a position corresponding to the sensor 26.

The underside of the pressurizing jig 30 brought into contact with the adhesive sheet 18 includes a plurality of depressions formed therein. These depressions 34 are respectively arranged at positions corresponding to second regions 50 of the interconnect substrate 40 which will be described later. Considering that air bubbles 54 (see FIG. 5) formed in the adhesive material 14 are effectively collected, the depth of each of the depressions 34 is preferably relatively deep or equal to or more than about 1 mm. The width of the depressions 34 may preferably be larger than that of a lead 52 formed in each of the second regions 50, for example.

On the opposite sides of the pressurizing jig 30 are located vertically movable hold-down jigs 28 for holding the adhesive sheet 18 when the pressurizing jig 30 is actuated and moved downward.

The applicator further includes a stand 32 on which the interconnect substrate (or package substrate) 40 is placed. When the adhesive material 14 is to be applied to the interconnect substrate 40 placed on the stand 32, the adhesive sheet 18 is fed out from the feed roller 10 and wound by the winding roller 12. The adhesive sheet 18 is turned at the hold-down rollers 20 to run along the interconnect substrate 40 in the horizontal direction.

When the cutter stop 24 is downward moved to hold the top surface of the adhesive sheet 18, the cutter 22 is simultaneously moved upward to cut the sheet-like adhesive material 14. After cutting, the cutter stop 24 is upward moved while at the same time the cutter is downward moved.

Subsequently, the hold-down jigs 28 are downward moved toward the adhesive sheet 18 to hold it. The pressurizing jig 30 is then downward moved to hold the adhesive material 14 against the interconnect substrate 40. At this time, the pressurizing jig 30 has been heated to a predetermined temperature (e.g., between about 100° C. and about 150° C.) such that the adhesive material 14 can be adhered to the interconnect substrate 40. In such a manner, the cut adhesive material 14 will be applied to the region of the interconnect substrate 40 on which semiconductor chips are to be mounted. The base film 16 is separated from the adhesive material 14 and turned by the hold-down roller 20 on the side of the winding roller 12 before the adhesive material 14 is wound around the winding roller 12.

(Interconnect Substrate)

Figure 2:
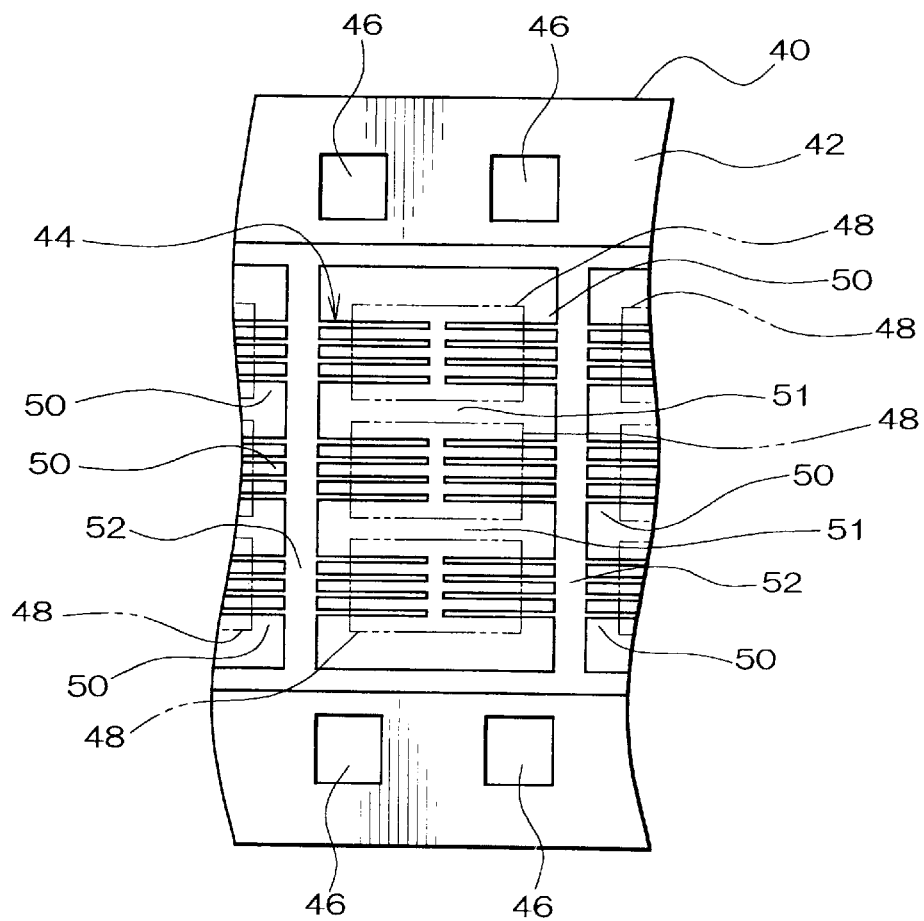
FIG. 2 illustrates a first embodiment of the present invention.

FIG. 2 shows the interconnect substrate 40 according to the first embodiment, which comprises a base 42 and an interconnect pattern 44. If this interconnect substrate 40 is produced based on the tape automated bonding (TAB) technique, it is in the form of a TAB substrate (or film carrier tape). However, the present invention is not limited to such a configuration, but may be applied to any other suitable form, such as chip-on-film (COF) or chip-on-board (COB) substrate.

The base 42 may be formed by either of an elongated (or tape-shaped) material or a segmented material. The base 42 is flexible. The base 42 is frequently formed of polyimide resin, but may be formed of any other suitable material. Since sprocket holes 46 are formed along the opposite side edges of the base 42, the interconnect substrate 40 can easily be fed through any suitable sprocket mechanism (not shown).

Figure 4:
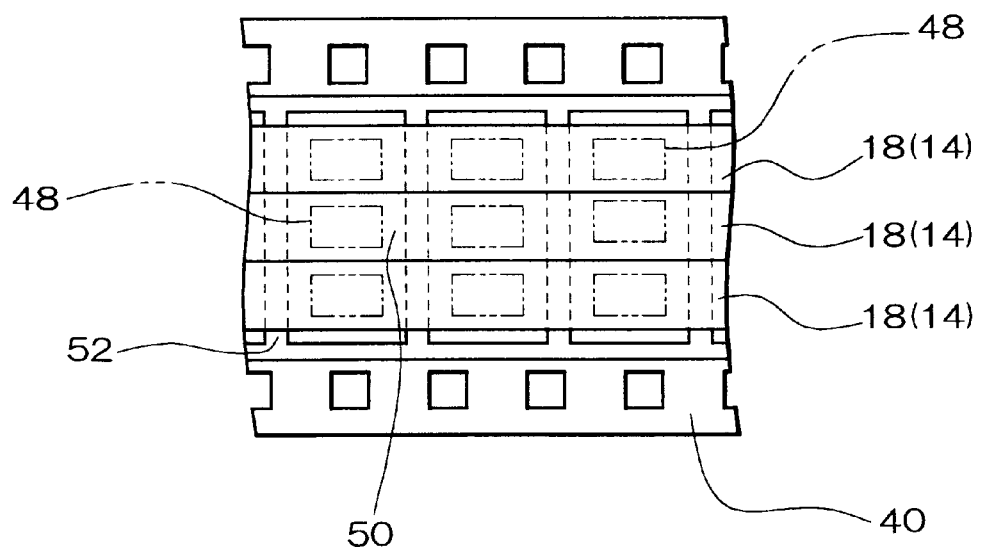
FIG. 4 illustrates a first embodiment of the present invention.

The base 42 further includes a plurality of first regions 48 and a plurality of second regions 50 located between each pair of first regions 48 adjacent to each other. Each of the first regions 48 is to be punched out to form part of the finished product such as semiconductor device or the like. The first region 48 will be punched out after electronic components including semiconductor chips and others have been adhered thereto. Since the base 42 has a plurality of such first regions 48, it is to be used for producing a plurality of products. The first regions 48 may be arranged in a linear line or in plural rows and columns (or in matrix form) as shown in FIG. 4.

Each of the second regions 50 is left after the first regions 48 have been punched out. The second regions 50 will also be arranged in a linear line if the first regions 48 are arranged in a linear line. If the first regions 48 are arranged in plural rows and columns, each second region 50 will be located between a pair of first regions 48 adjacent to each other. If a plurality of first regions 48 are arranged adjacent to one first region 48, it is not necessary that there are the second regions 50 between that first region 48 and all the adjacent first regions 48. There may be a second region 50 between that first region 48 and at least one of the adjacent first regions 48.

In such an example as shown in FIG. 1, the second regions 50 exist between each pair of adjacent first regions 48 among the first regions 48 arranged in matrix as viewed in the longitudinal direction of the base 42 (or in the lateral direction as viewed in FIG. 1). In the direction of width of the base 42 (or in the vertical direction as viewed in FIG. 1), a region 51 exists between each pair of adjacent first regions 48, rather than the second region 50.

The base 42 supports the interconnect pattern 44. If the interconnect substrate 40 is of triple-layer configuration, the interconnect pattern is adhered to the base 42 through an adhesive (not shown). If the interconnect substrate 40 is of double-layer configuration, the interconnect pattern 44 is formed directly on the base 42 without any adhesive. The interconnect pattern 44 may be a lamination formed of any material selected from a group consisting of copper (Cu), chromium (Cr), titanium (Ti), nickel (Ni), titanium-tungsten (Ti—W). Alternatively, the interconnect pattern 44 may be formed by a layer made of any material mentioned above. It is preferred that the interconnect pattern 44 is plated by any material selected from a group consisting of solder, tin, gold, nickel and others. It is also preferred that the metal plating is performed to provide an eutectic, since the metal bonding can easily be attained.

The interconnect pattern 44 is formed over at least the first regions 48 of the base 42. Within the range of the first regions 48, the interconnect pattern 44 is formed so that the electrodes of the electronic components such as semiconductor chips and others are electrically connected to external terminals. Although the interconnect pattern 44 is schematically illustrated in FIG. 1, it is actually formed with lands and bents within the first regions 48.

The interconnect pattern 44 has leads 52 in the second regions 50. The leads 52 may be plated leads usable for electrically connecting all the components of the interconnect pattern 44 to perform the electrolytic plating.

(Process of Applying Adhesive Material)

Figure 3:
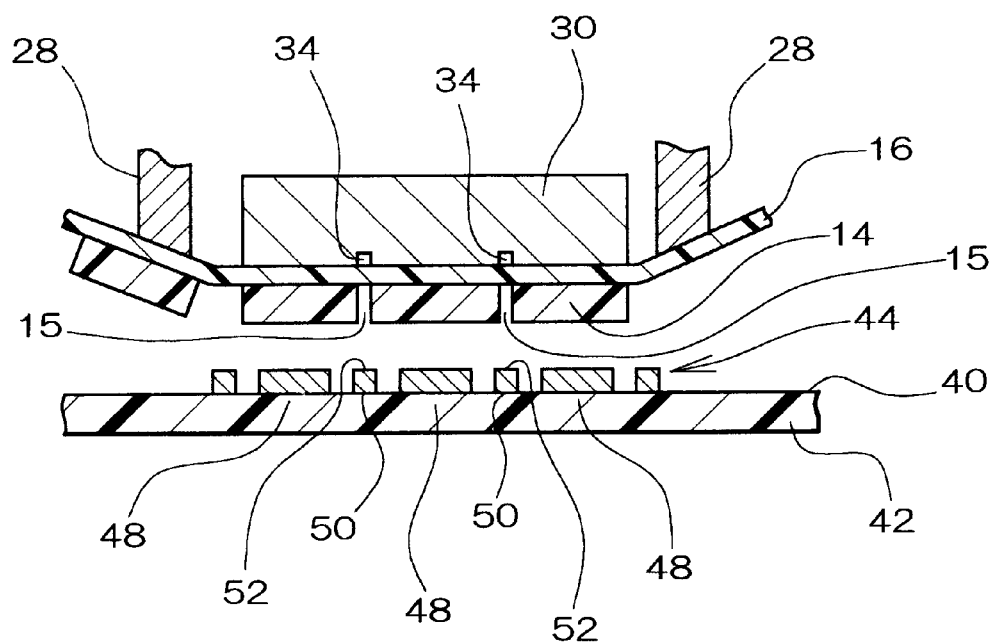
FIG. 3 illustrates a first embodiment of the present invention.
Figure 5:
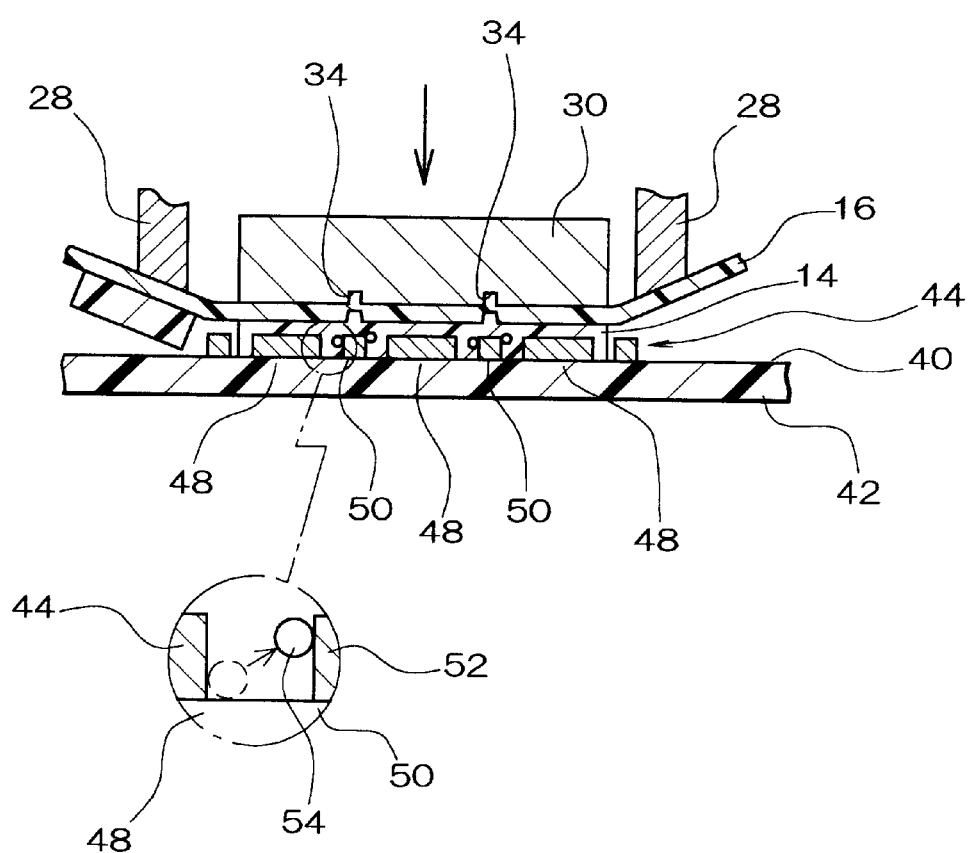
FIG. 5 illustrates a first embodiment of the present invention.

FIGS. 3–5 illustrate a process of applying an adhesive material according to the first embodiment of the present invention. In the first embodiment, spaces 15 are formed in the adhesive material 14 in addition to the depressions 34 of the pressurizing jig 30.

Each of the spaces 15 may be formed by a groove. Preferably, the spaces 15 communicate with outside so that the adhesive material 14 can be shrunk during the subsequent pressurizing step. As shown in FIG. 3, the spaces 15 are opened toward the interconnect substrate 40. However, the spaces 15 may be opened toward the pressurizing jig 30. Alternatively, the spaces 15 may be opened toward outside in a direction different from the interconnect substrate 40 and pressurizing jig 30.

Considering that air bubbles formed in the adhesive material 14 can effectively be collected, the depth in the spaces 15 is preferably relatively deep or equal to or more than about 1 mm. The width in the spaces 15 may be larger than the width of each lead 52 formed in the second regions 50 and sufficient to completely contain the lead 52.

As shown in FIG. 3, the depressions 34 and spaces 15 are arranged above the second regions 50 of the interconnect substrate 40 when the adhesive material 14 is to be applied to the interconnect substrate 40.

In the first embodiment, the adhesive material 14 may include a plurality of adhesive sheets 18 applied to the interconnect substrate 40, as shown in FIG. 4. These adhesive sheets 18 are so applied that one of the adhesive sheets 18 continuously covers a linear group of first regions 48 in the longitudinal direction of the interconnect substrate 40 (or in the lateral direction as viewed in FIG. 4). Thus, in the direction of width of the interconnect substrate 40 (or in the vertical direction as viewed in FIG. 4), air bubbles can escape through gaps between the adhesive sheets 18.

As shown in FIG. 5, the adhesive material 14 is pressure bonded to the interconnect substrate 40. The adhesive material 14 is arranged to extend from the first regions 48 to at least part of the second regions 50 adjacent to that first regions 48. The adhesive material 14 is pressed against the interconnect substrate 40 by the pressurizing jig 30 through the base film 16. After initiation of the pressing, air bubbles 54 will be formed in the first regions 48 at corners between the interconnect pattern 44 and the base 42, as shown in FIG. 5. As the pressure is further exerted, a part of the adhesive material 14 within the first regions 48 flows into the second regions 50.

For example, the adhesive material 14 flows toward the depressions 34 located above the second regions 50. Such an action is possible since the base film 16 is flexible and deformable toward the depressions 34. The adhesive material flows so that the spaces 15 above the second regions 50 are reduced (see FIG. 3). To this end, the spaces 15 preferably communicate with outside.

Thus, the air bubbles 54 also move to the second regions 50 as the adhesive material 14 flows from the first regions 48 to the second regions 50. After the application of the adhesive material 14 has been completed, the base film 16 is separated from the adhesive material 14.

In such a manner, the adhesive material 14 can be applied to the interconnect substrate 40. When the adhesive material 14 is provided to the interconnect substrate 40 in the first embodiment, the air bubbles 54 will be formed in the first regions 48 at the corners between the base 42 and the interconnect pattern 44 since it is difficult to completely fill the corners with the adhesive material 14. However, when the adhesive material 14 is pressurized against the interconnect substrate 40, part of the adhesive material 14 within the first regions 48 flows into the second regions 50 together with the air bubbles 54. Therefore, the amount of air bubbles 54 can be reduced in the first regions 48. This lowers the probability of failure in the finished products in which such interconnect substrates 40 are used, leading to improvements of the productivity and yield. On the other hand, the presence of air bubbles 54 in the second regions 50 will not raise any problem since the second regions 50 are regions left after the first regions 48 have been punched out.

(Interconnect Substrate with Adhesive Material)

The interconnect substrate 40 on which the adhesive material 14 has been applied through the aforementioned process has the base 42, the interconnect pattern 44 formed on the base 42 and the adhesive material 14 applied onto the base and interconnect pattern 42, 44. The base 42 has a plurality of first regions 48 to be punched out and second regions arranged between adjacent first regions 48. The interconnect pattern 44 is formed over at least the first regions 48 in the base 42. The adhesive material 14 is applied to extend from the first regions 48 to at least part of the second regions 50. A plurality of tape-shaped adhesive material portions 14 may be applied to the interconnect substrate 40 along the longitudinal direction thereof. If the first regions 48 are arranged in plural rows and columns as shown in FIG. 4, a plurality of tape-shaped adhesive material portions 14 may be arranged parallel in the direction of width of the interconnect substrate 40.

In the first embodiment, the air bubbles 54 formed at the corners between the base 42 and the interconnect pattern 44 move to the second regions 50. In such an interconnect substrate 40, the probability of failure can be lowered in the finished products in which such interconnect substrates 40 are used, leading to improvements of the productivity and yield. On the other hand, the presence of air bubbles 54 on the second regions 50 will not raise any problem since the second regions 50 are regions left after the first regions 48 have been punched out.

Second Embodiment

Figure 6:
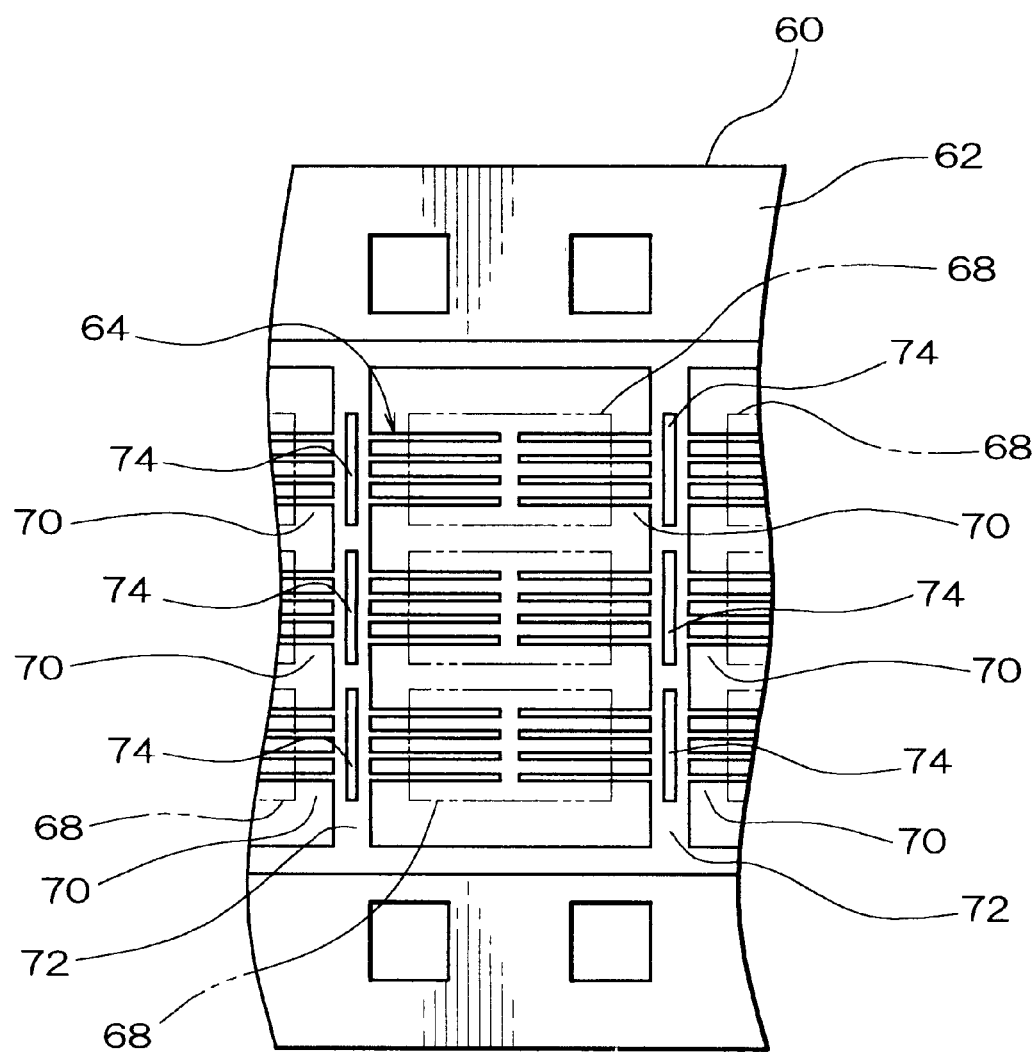
FIG. 6 illustrates a second embodiment of the present invention.
Figure 7:
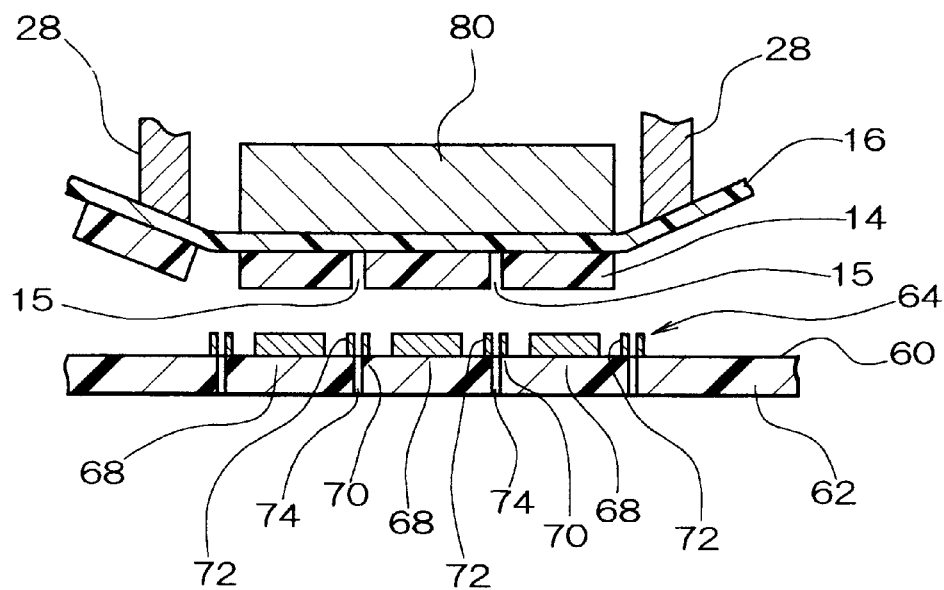
FIG. 7 illustrates a second embodiment of the present invention.
Figure 8:
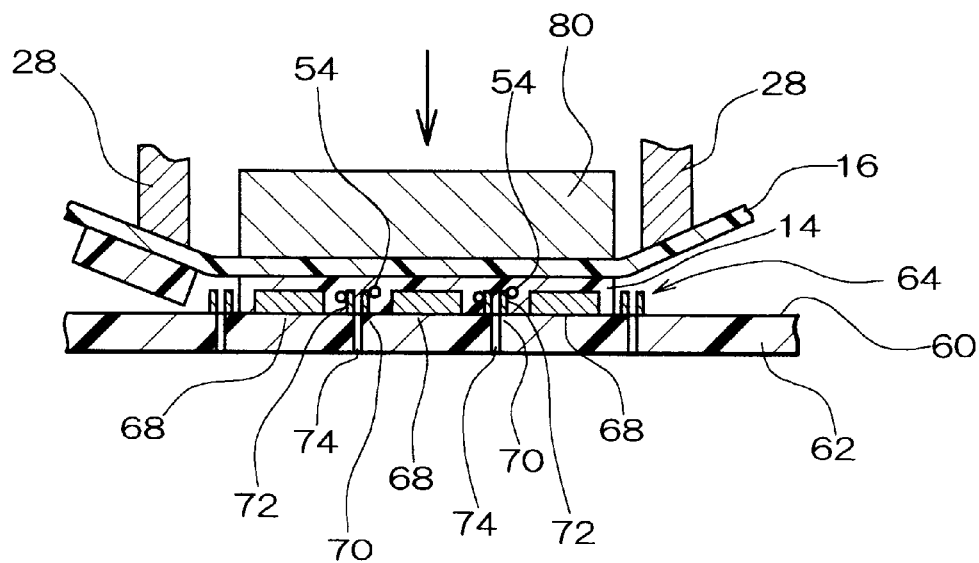
FIG. 8 illustrates a second embodiment of the present invention.

FIGS. 6–8 show the second embodiment of the present invention.

(Interconnect Substrate)

The second embodiment uses such an interconnect substrate 60 as shown in FIG. 6. The interconnect substrate 60 includes a base 62 and an interconnect pattern 64 formed thereon. The interconnect substrate 60 also includes first regions 68 and second regions 70. The first and second regions 68, 70 correspond to the first and second regions 48, 50 described in connection with the first embodiment, respectively. The interconnect pattern 64 includes leads 72 in the second regions 70. Each of the second regions 70 includes through-holes 74 formed therethrough. More particularly, each of the second regions 70 includes through-holes 74 formed through the lead 72 and base 62. The through-holes 74 are formed through the respective leads 72 at the center thereof in the direction of width. FIG. 6 shows a plurality of through-holes 74 formed through one lead 72 in the direction of width of the base 72. However, only one continuous through-hole may be formed. Each of the through-holes 74 is shown as an elongated slit in FIG. 6, but may be in the form of a circular hole, an elongated slot or other.

The interconnect substrate 60 is similar to the interconnect substrate 40 described in connection with the first embodiment, except that the through-holes 74 are formed therethrough.

(Process of Applying Adhesive Material)

FIGS. 7 and 8 illustrate a process of applying an adhesive material according to the second embodiment. In the second embodiment, the adhesive material 14 described in connection with the first embodiment is to be applied to the interconnect substrate 60. Although the pressurizing jig 30 including the depressions 34 formed therein is used in the first embodiment, the second embodiment uses a pressurizing jig 80 having a flat pressurizing surface. As a modified form, it may be considered to use the pressurizing jig 30 with the depressions 34. An applicator usable in the second embodiment is similar to that of the first embodiment, except that the pressurizing jig 80 is used therein.

The process of applying the adhesive material 14 is similar to that of the first embodiment. Since the interconnect substrate 60 includes the through-holes 74 formed through the second regions 70, the adhesive material 14 will flow into the through-holes 74. Namely, the adhesive material 14 will flow toward the second regions 70. Thus, air bubbles 54 formed at the corners between the interconnect pattern 64 and the base 62 will be moved onto the second regions 70.

The functions and advantages of the second embodiment are similar to those of the first embodiment. The interconnect substrate to which the adhesive material is applied is also similar to that of the first embodiment, except that the through-holes 74 are formed through the interconnect substrate 60.

Third Embodiment

Figure 9:
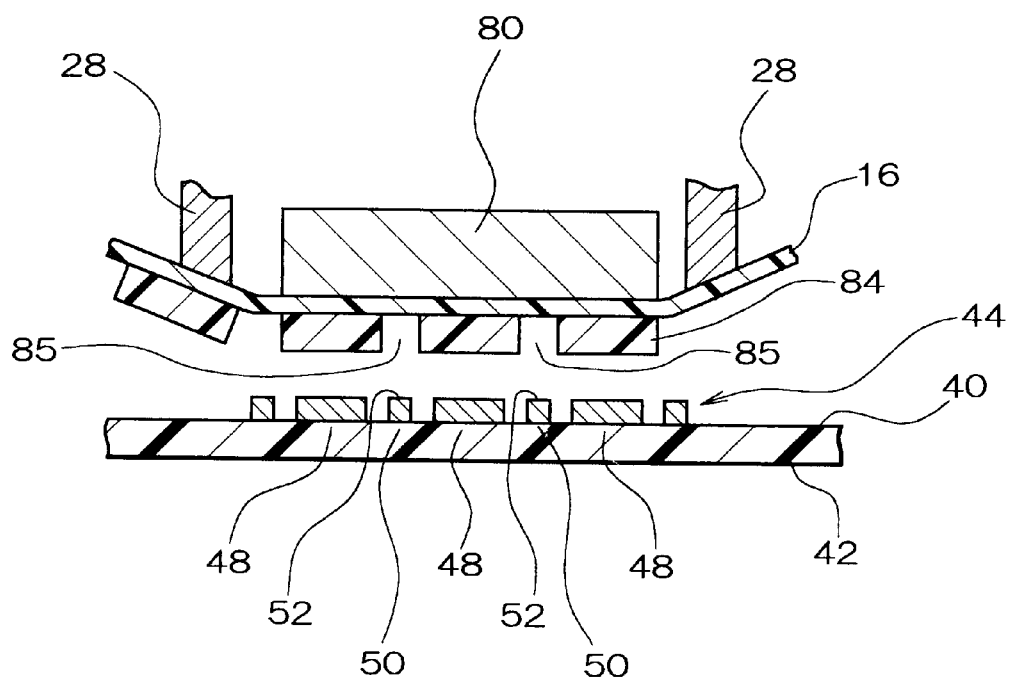
FIG. 9 illustrates a third embodiment of the present invention.

FIG. 9 shows the third embodiment of the present invention. The third embodiment also uses the interconnect substrate 40 described in connection with the first embodiment. A adhesive material 84 is to be applied to the interconnect substrate 40. The adhesive material 84 is similar to that of the first embodiment, except that spaces 85 are different in shape from those of the adhesive material 14 described in connection with the first embodiment.

Each of the spaces 85 is formed into such a size that one lead 52 in the interconnect substrate 40 is completely contained in the space 85. The size in the spaces 85 is larger than that of the spaces 15 in the first embodiment, the adhesive material 84 can easily flow to move the bubbles 54 (see FIG. 5). Since the adhesive material 84 is brought into contact with the interconnect substrate 40 prior to the leads 52, the flowing of the adhesive material 84 will not be obstructed by the leads 52 at least in the beginning of flow. The other functions and advantages of the third embodiment are similar to those of the first embodiment.

Since in the third embodiment, the adhesive material 84 can easily flow as described, the pressurizing jig 30 formed with the depressions 34 may be used rather than the pressurizing jig 80 described in connection with the second embodiment. The contents described in connection with the third embodiment may be applied to the other embodiments.

Fourth Embodiment

Figure 10:
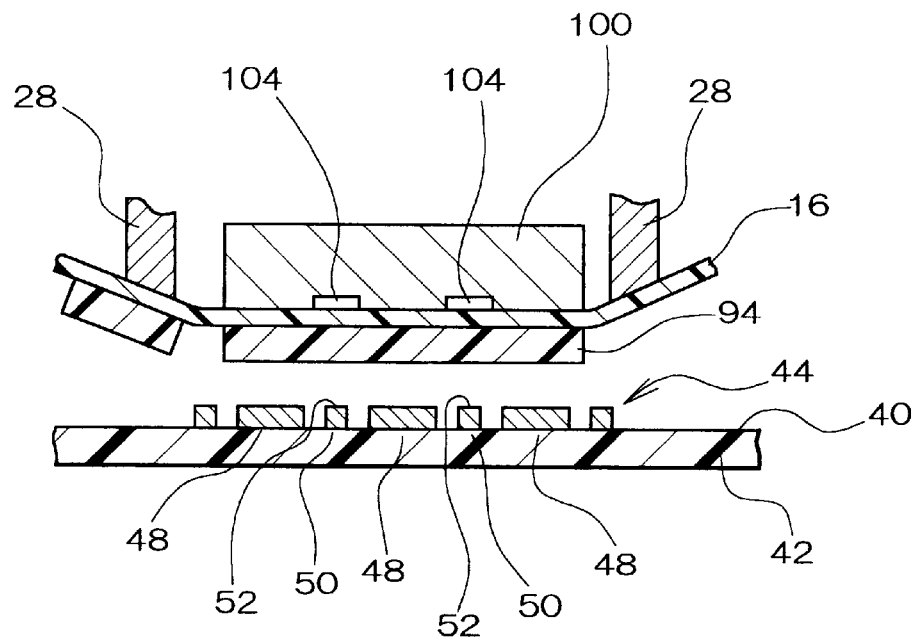
FIG. 10 illustrates a fourth embodiment of the present invention.
Figure 11:
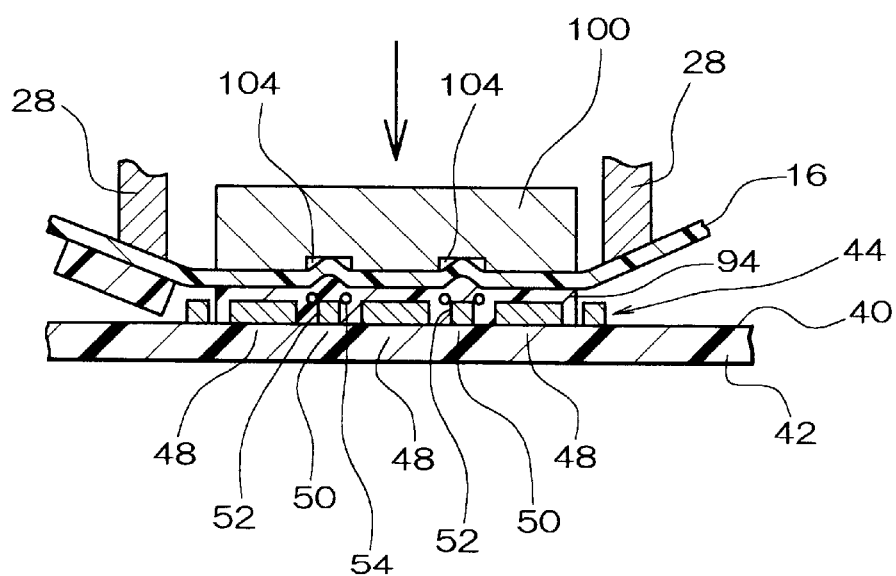
FIG. 11 illustrates a fourth embodiment of the present invention.

FIGS. 10 and 11 show the fourth embodiment of the present invention which uses the interconnect substrate 40 described in connection with the first embodiment. An adhesive material 94 is to be applied to the interconnect substrate 40. The adhesive material 94 is similar to the adhesive material 14 described in connection with the first embodiment, except that no space is formed therein.

The adhesive material 94 is applied to the interconnect substrate 40 using a pressurizing jig 100. The pressurizing jig 100 includes depressions 104 formed therein. Each of the depressions 104 is formed into such a size that it completely contains one lead 52 in the interconnect substrate 40. Each of the depressions 104 is thus larger than that of the first embodiment.

As shown in FIG. 11, the base film 16 is deformed into a degree larger than that of the first embodiment when the adhesive material 94 is pressurized by the pressurizing jig 100. Thus, the adhesive material 94 can easily flow to move the air bubbles 54. The other functions and advantages of the fourth embodiment are similar to those of the first embodiment.

Since in the fourth embodiment, the adhesive material 94 can easily flow as described, the adhesive material 94 has no space, but may have spaces. The pressurizing jig 100 of the fourth embodiment may be used in any of the other embodiments.

Fifth Embodiment

Figure 12:
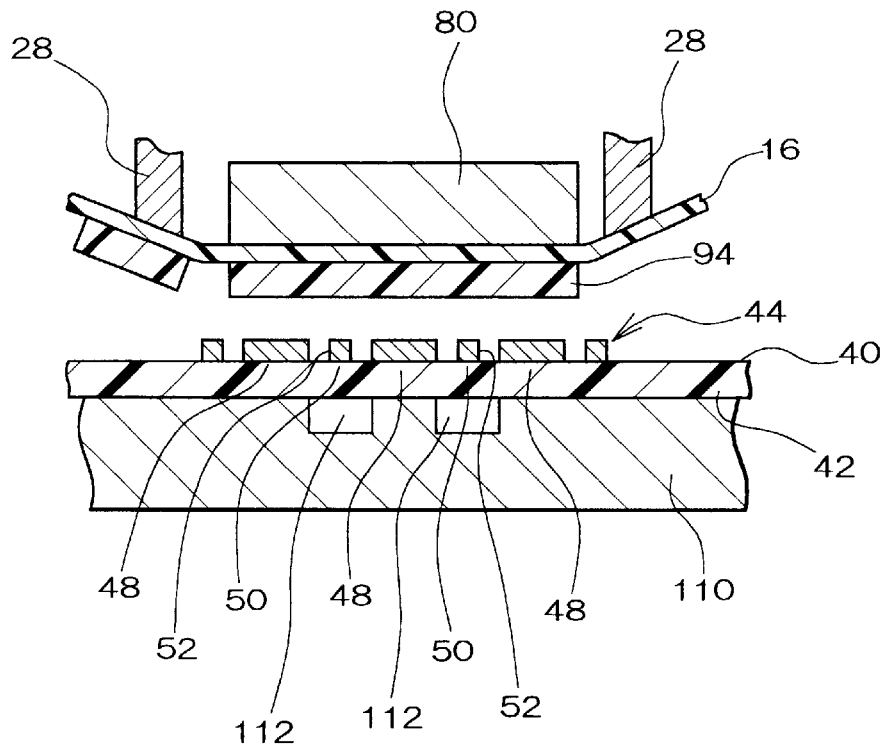
FIG. 12 illustrates a fifth embodiment of the present invention.
Figure 13:
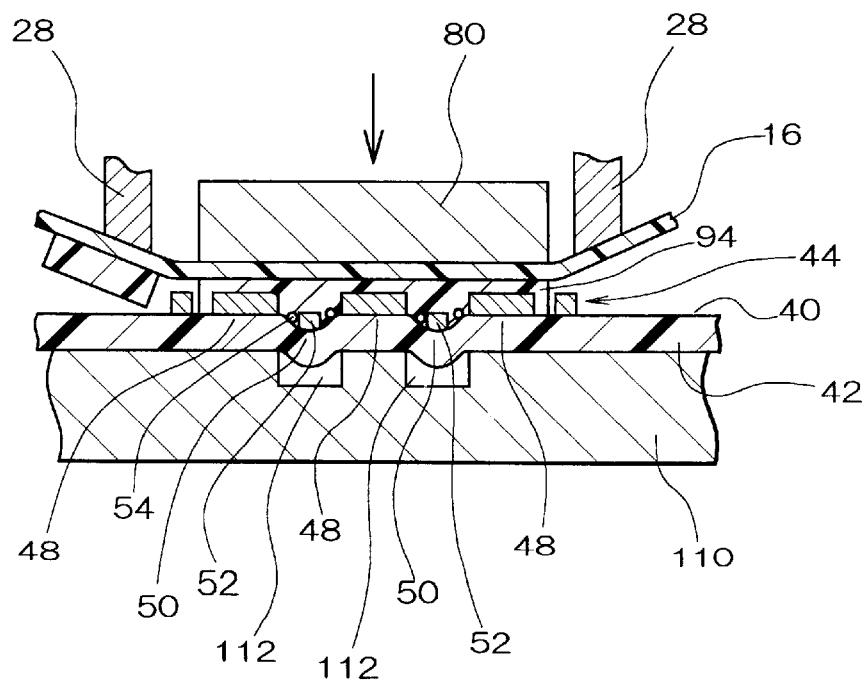
FIG. 13 illustrates a fifth embodiment of the present invention.

FIGS. 12 and 13 show the fifth embodiment of the present invention which uses the interconnect substrate 40 described in connection with the first embodiment. An adhesive material 94 is to be applied to the interconnect substrate 40. The adhesive material 94 is similar to the adhesive material 14 described in connection with the first embodiment, except that no space is formed therein.

When the adhesive material 94 is applied to the interconnect substrate 40, the pressurizing jig 80 described in connection with the second embodiment (see FIG. 7) is used together with a stand 110. The stand 110 includes depressions 112 formed therein. The depressions 112 are formed in the stand 110 at positions corresponding to the respective second regions 50 of the interconnect substrate 40. Each of the depressions 112 has such a size that it completely contains one of leads 52 formed in the second regions 50.

As shown in FIG. 13, when the adhesive material 94 is pressurized by the pressurizing jig 80, the interconnect substrate 40 is deformed. More particularly, the surface of the interconnect substrate 40 on which the interconnect pattern 44 is formed is dented toward the depressions 112. Since the second regions 50 of the base 42 is dented, the adhesive material 94 will flow toward the second regions 50 together with the air bubbles 54. The other functions and advantages of the fifth embodiment are similar to those of the first embodiment.

Since no space will be formed in the adhesive material 94 in the fifth embodiment since the adhesive material 94 can easily flow as described, spaces may be formed, if desired. The stand 110 described in connection with the fifth embodiment may be used in the other embodiments.

Sixth Embodiment

Figure 14:
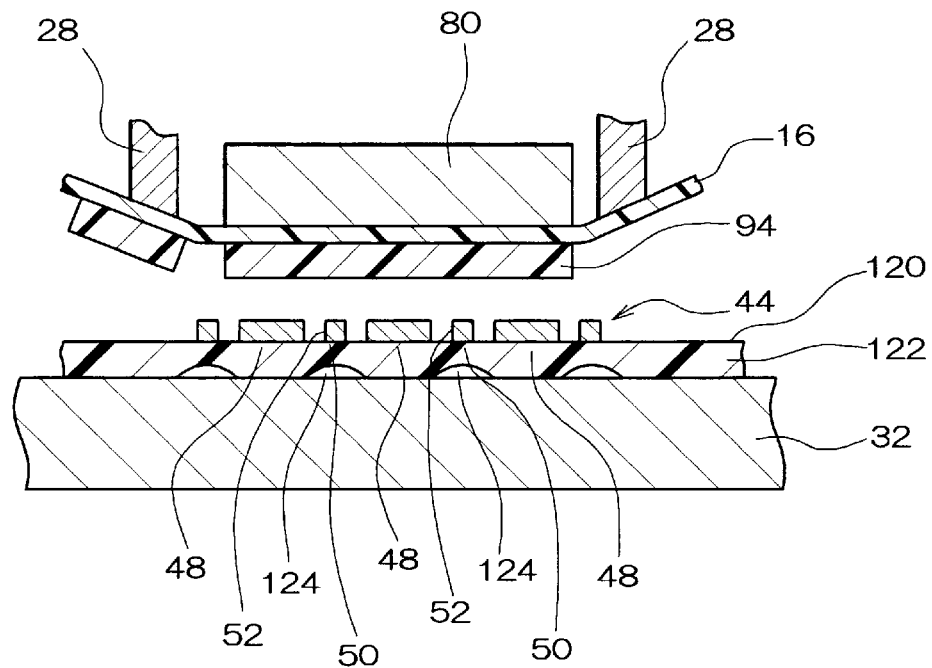
FIG. 14 illustrates a sixth embodiment of the present invention.
Figure 15:
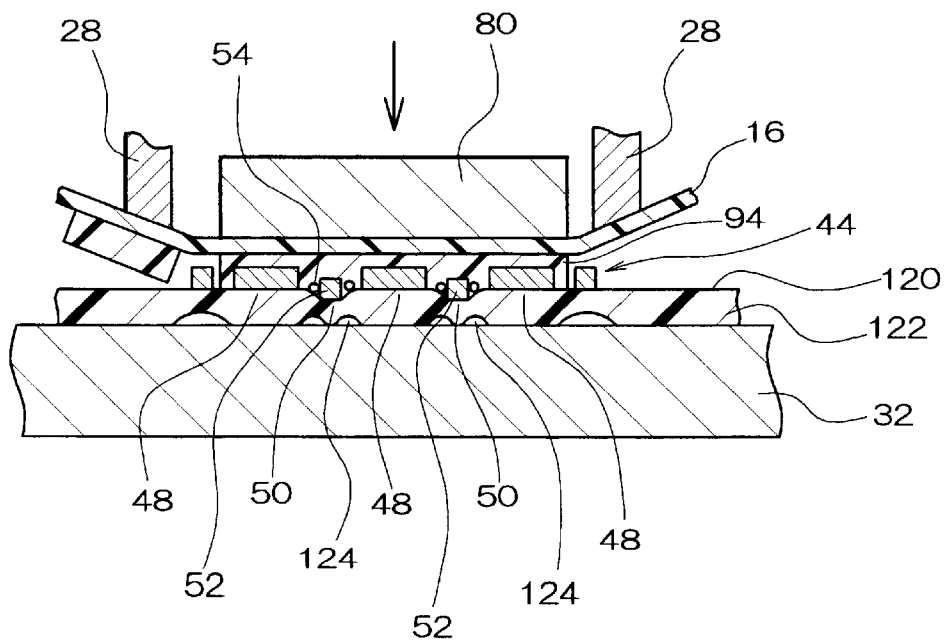
FIG. 15 illustrates a sixth embodiment of the present invention.

FIGS. 14 and 15 show the sixth embodiment of the present invention which uses an interconnect substrate 120 similar to the interconnect substrate 40 described in connection with the first embodiment, except that it includes a base 122 formed with depressions 124. Therefore, similar parts will be denoted by similar reference numerals.

The depressions 124 are formed in the base 122 on the surface thereof opposite to the interconnect pattern 44. These depressions 124 are located below the lead 52 in the second regions 50. Preferably, each of the depressions 124 has such a size that it completely contains one lead 52. Although FIG. 14 shows the depressions 124 each having an arcuate cross-section, their cross-section may be semi-circular or U-shaped, or any polygonal form such as rectangular, triangular and others.

In this embodiment, the adhesive material 94 is to be applied to the interconnect substrate 120. The adhesive material 94 is similar to the adhesive material 14 described in connection with the first embodiment, except that no space is formed. When the adhesive material 94 is to be applied to the interconnect substrate 120, the pressurizing jig 80 described in connection with the second embodiment (see FIG. 7) is used together with the stand 32 described in connection with the first embodiment.

When the adhesive material 94 is pressurized by the pressurizing jig 80 as shown in FIG. 15, the interconnect substrate 120 will be deformed. In other words, the depressions 124 in the base 122 will be deformed so that the surface of the base 122 on which the interconnect pattern 44 is formed is dented toward the depressions 124. Since the second regions 50 of the base 122 are dented, the adhesive material 94 can flow toward the second regions 50 so that the air bubbles 54 also move toward the second regions 50. The other functions and advantages of the sixth embodiment are similar to those of the first embodiment.

Since no space will be formed in the adhesive material 94 in the fifth embodiment since the adhesive material 94 can easily flow as described, spaces may be formed, if desired. The interconnect substrate 120 described in connection with the sixth embodiment may be used in the other embodiments.

Seventh Embodiment

Figure 16:
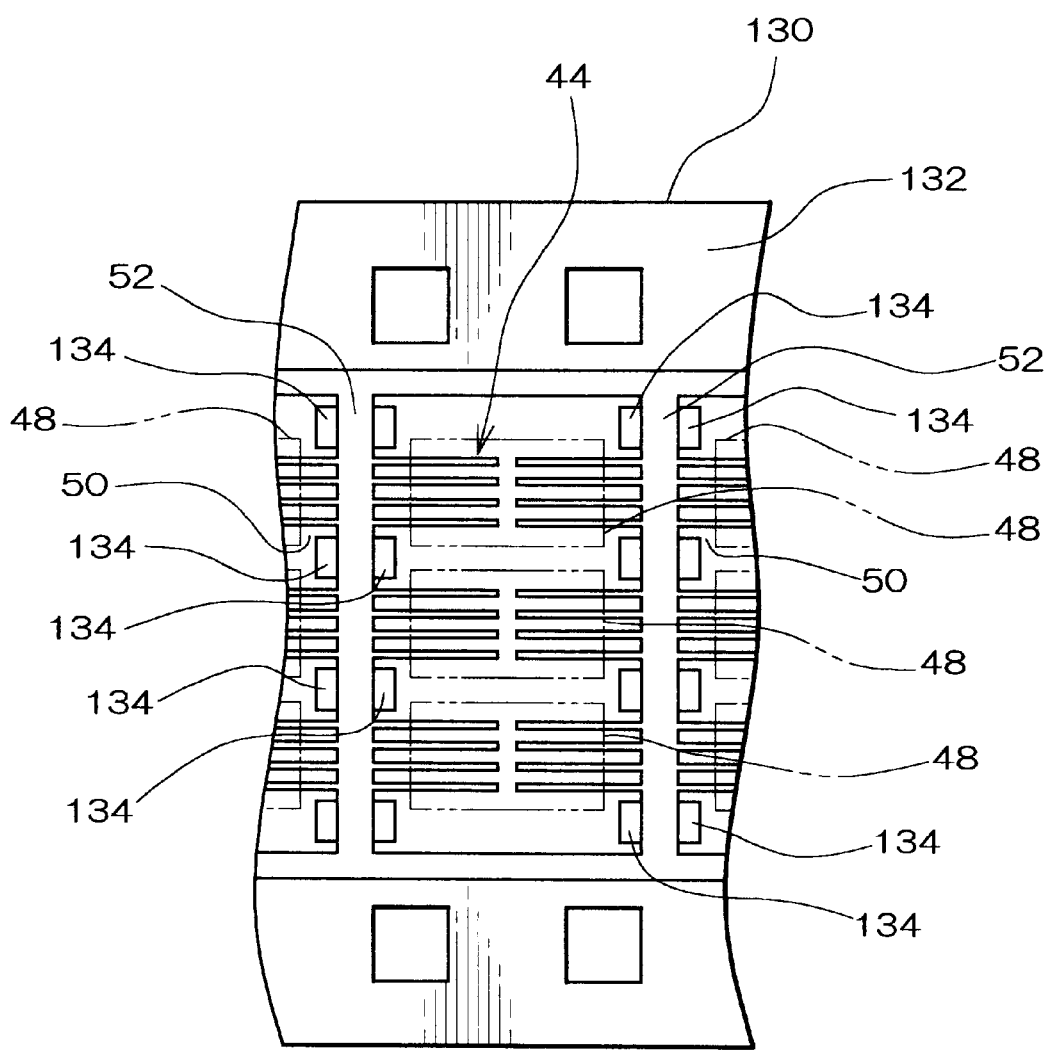
FIG. 16 illustrates a seventh embodiment of the present invention.
Figure 17:
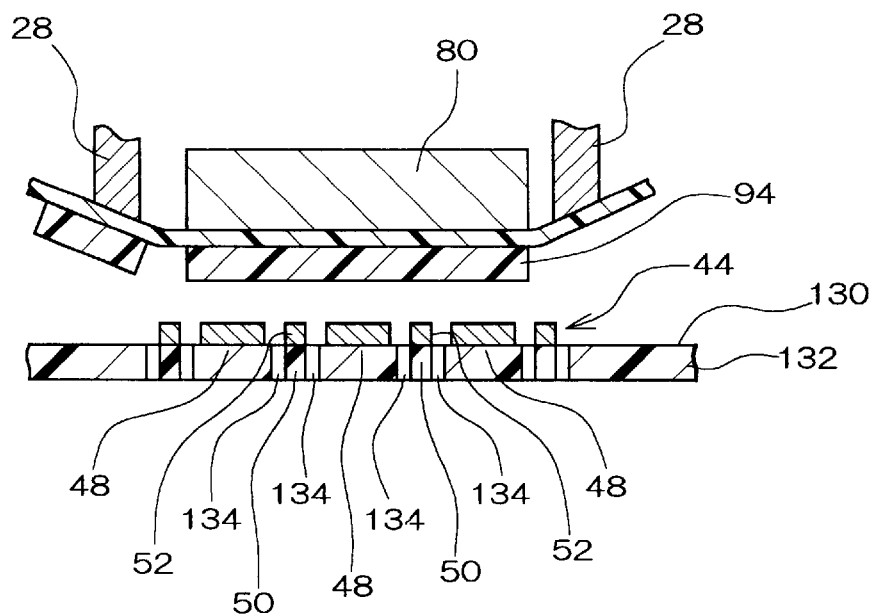
FIG. 17 illustrates a seventh embodiment of the present invention.
Figure 18:
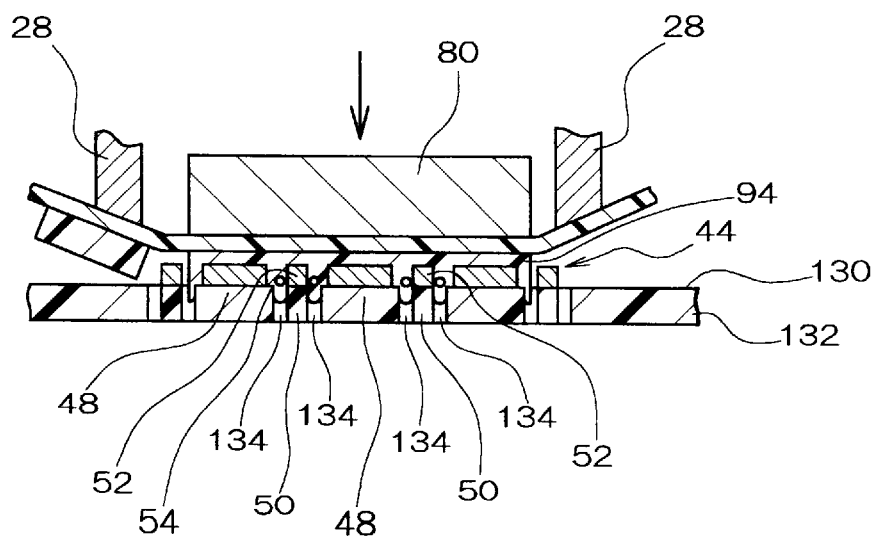
FIG. 18 illustrates a seventh embodiment of the present invention.

FIGS. 16–18 show the seventh embodiment of the present invention which uses an interconnect substrate 130 similar to the interconnect substrate 40 described in connection with the first embodiment, except that it includes a base 132 formed with through-holes 134. Therefore, similar parts will be designated by similar reference numerals.

The through-holes 134 are formed in the second regions 50 of the base 132 at positions adjacent to the respective leads 52. For example, if the leads 52 extend in the direction of width of the base 132, the through-holes 134 are located adjacent to the respective leads 52 in the longitudinal direction of the base 132. The through-holes 134 may be formed adjacent to the opposite sides of one lead 52. The through-holes 134 may be in contact or non-contact with the leads 52.

The through-holes 134 are formed not to overlap the interconnect pattern 44. As shown in FIG. 16, a plurality of such through-holes 134 may be arranged along the direction of width of the base 132.

FIG. 16 shows an example in which a plurality of interconnect portions are formed to extend from the respective leads 52 to the first regions 48. A group of interconnect portions reaches one first region 48. In this case, the through-holes 134 are located between adjacent groups of interconnect portions reaching the respective first regions 48.

As shown in FIGS. 17 and 18, the adhesive material 94 is to be applied to the interconnect substrate 130. The adhesive material 94 is similar to the adhesive material 14 described in connection with the first embodiment, except that no space is formed. When the adhesive material 94 is to be applied to the interconnect substrate 130, the pressurizing jig 80 described in connection with the second embodiment (see FIG. 7) is used.

When the adhesive material 94 is pressurized by the pressurizing jig 80 as shown in FIG. 18, the adhesive material 94 flows toward the through-holes 134. In other words, the adhesive material 94 can flow toward the second regions 50 together with the air bubbles 54. The other functions and advantages of the seventh embodiment are similar to those of the first embodiment.

Since no space will be formed in the adhesive material 94 in the fifth embodiment since the adhesive material 94 can easily flow as described, spaces may be formed, if desired. The interconnect substrate 130 described in connection with the seventh embodiment may be used in the other embodiments.

Eighth Embodiment

Figure 20:
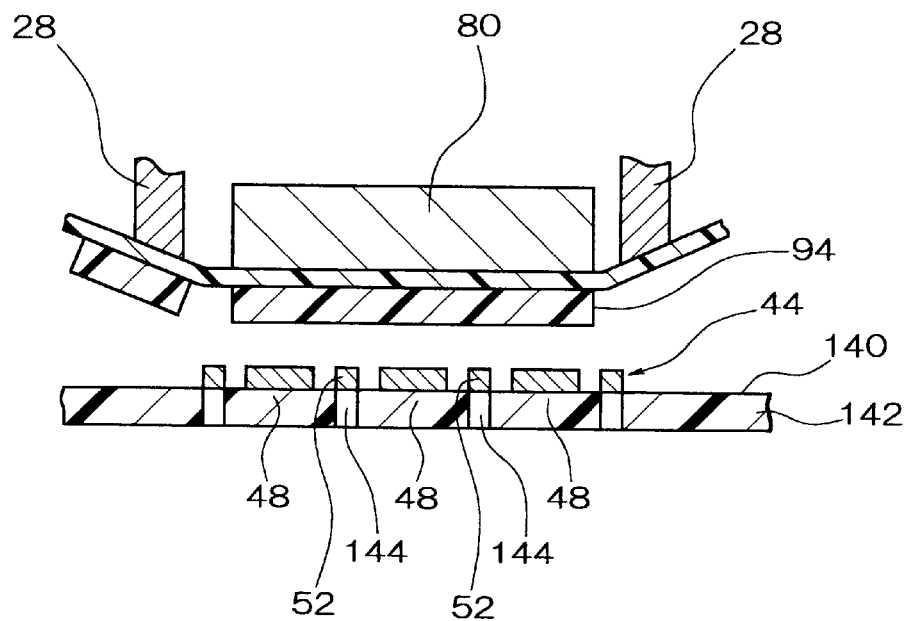
FIG. 20 illustrates an eighth embodiment of the present invention.
Figure 21:
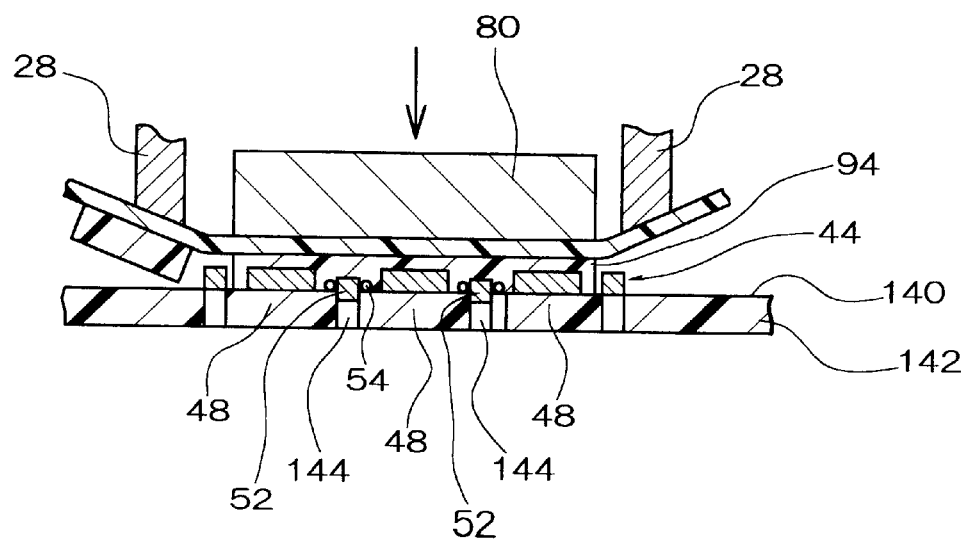
FIG. 21 illustrates an eighth embodiment of the present invention.
Figure 22:
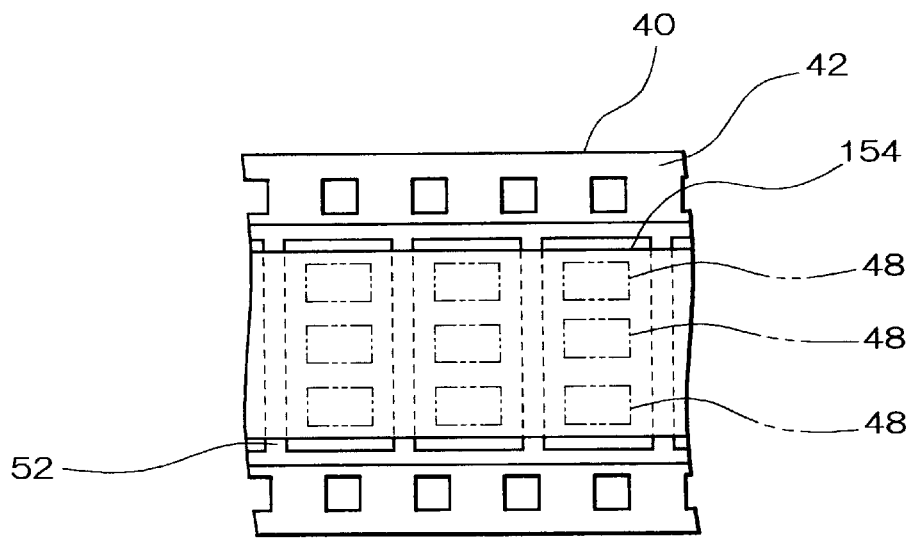
FIG. 22 illustrates a ninth embodiment of the present invention.

FIGS. 19–21 show the eighth embodiment of the present invention which uses an interconnect substrate 140 similar to the interconnect substrate 40 described in connection with the first embodiment, except that its base 142 includes through-holes 144 formed therethrough. Therefore, similar parts will be denoted by similar reference numerals.

The through-holes 144 are formed in the second regions 50 of the base 142 below the respective leads 52. Each of the through-holes 144 may have its width equal to or larger than that of the leads 52. Although the through-holes 144 penetrate the base 142, they may completely be covered with the respective leads 52 as shown in FIG. 19 or may be so formed that each of the leads 52 passes through part of the corresponding through-hole 144. A plurality of such through-holes 144 may be formed in line along the direction of width of the base 132.

In an example of FIG. 19, a plurality of interconnect portions are formed to extend from the respective leads 52 to the first regions 48. A group of interconnect portions reaches one first region 48. In this case, the through-holes 144 are located between adjacent groups of interconnect portions reaching the respective first regions 48.

As shown in FIGS. 20 and 21, the adhesive material 94 is to be applied to the interconnect substrate 130. The adhesive material 94 is similar to the adhesive material 14 described in connection with the first embodiment, except that no space is formed. When the adhesive material 94 is to be applied to the interconnect substrate 130, the pressurizing jig 80 described in connection with the second embodiment (see FIG. 7) is used.

When the adhesive material 94 is pressurized by the pressurizing jig 80 as shown in FIG. 21, part of the leads 52 enters the through-holes 144 of the base 142 and surfaces of the leads 52 are partially dented. The adhesive material 94 flows toward the dent so that the air bubbles 53 move toward the second regions 50. The other functions and advantages of the eighth embodiment are similar to those of the first embodiment.

Since no space will be formed in the adhesive material 94 in the fifth embodiment since the adhesive material 94 can easily flow as described, spaces may be formed, if desired. The interconnect substrate 140 described in connection with the eighth embodiment may be used in the other embodiments.

Ninth Embodiment

FIGS. 22–25 show the ninth embodiment of the present invention which uses the interconnect substrate 40 described in connection with the first embodiment (see FIG. 2) to apply a adhesive material 154 onto the interconnect substrate 40. Although the adhesive material 14 in the first embodiment includes a plurality of adhesive material portions arranged parallel in the direction of width of the base 42, the adhesive material 154 used in the ninth embodiment is integrally formed. In other words, the adhesive material 154 has a width sufficient to cover all the first regions 48 which are arranged in the direction of width of the base 42.

Figure 23:
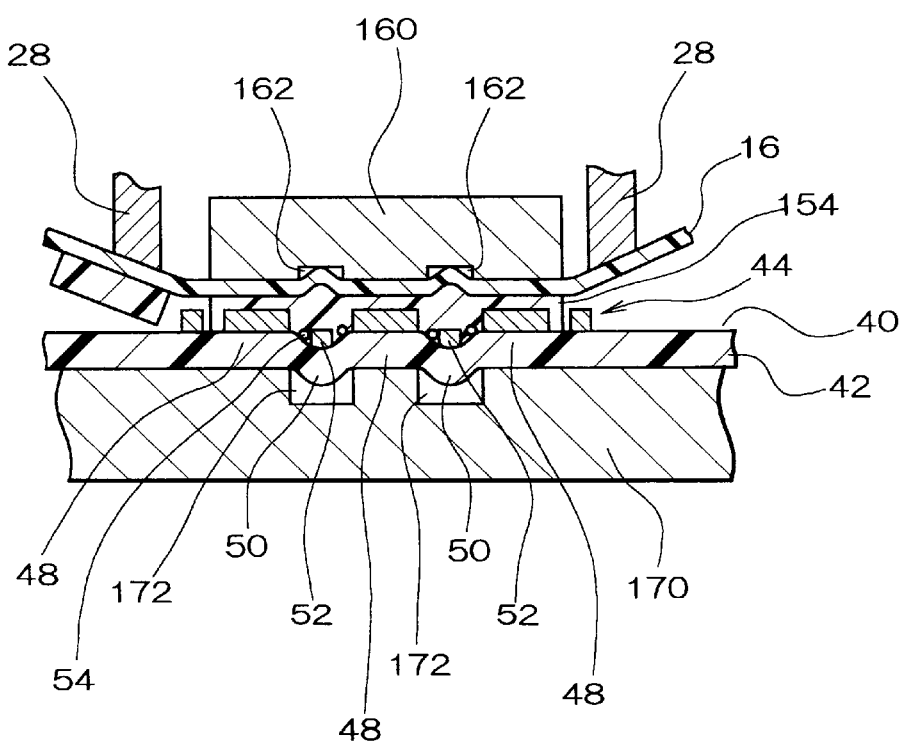
FIG. 23 illustrates a ninth embodiment of the present invention.

When the adhesive material 154 is to be applied to the interconnect substrate 40 as shown in FIG. 23, a pressurizing jig 160 is used together with a stand 170.

Figure 24:
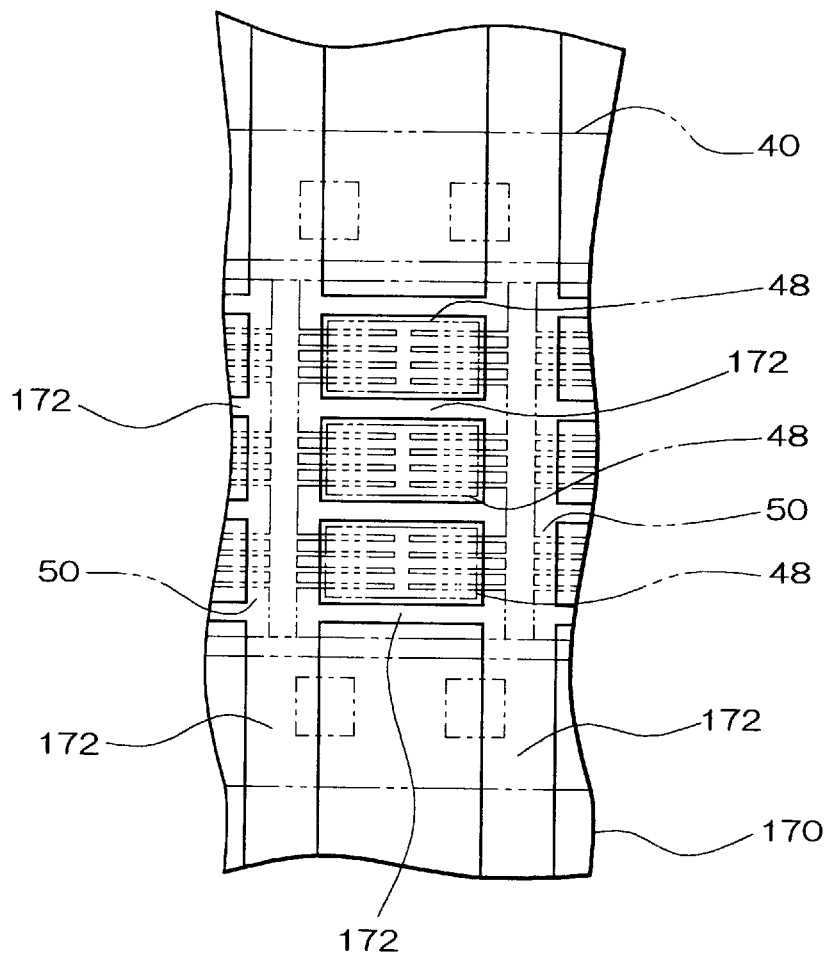
FIG. 24 illustrates a ninth embodiment of the present invention.

FIG. 24 is a plan view of part of the stand 170. The interconnect substrate 40 is placed on the stand 170. The stand 170 has a flat surface for supporting the underside of the interconnect substrate 40 opposite to the first regions 48. The stand 170 also includes depressions 172 formed therein below the second regions 50 of the interconnect substrate 40. As shown in FIG. 23, the second regions 50 of the base 42 can be deformed. The depressions 172 may be formed in the other portion of the stand 170 unless they overlap the first regions 48. For example, the example of FIG. 24 includes further depressions 172 formed therein between the first regions 48 that are arranged in the direction of width of the interconnect substrate 40. Thus, any portion adjacent to a first region 48 in the direction of width of the interconnect substrate 40 (or a portion of the base 42) can also be deformed. The depressions 172 may be arranged in a grid as shown in FIG. 24.

Figure 25:
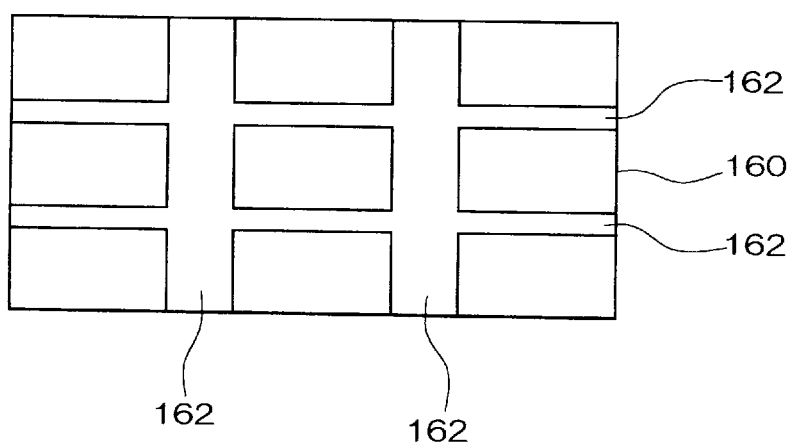
FIG. 25 illustrates a ninth embodiment of the present invention.

FIG. 25 is a plan view of the pressurizing jig 160 which has a flat surface used to pressurize the first regions 48 in the interconnect substrate 40. The pressurizing jig 160 also includes depressions 162 formed therein at positions above the second regions 50 in the interconnect substrate 40. In such a manner, as shown in FIG. 23, part of the base film 16 above the second regions 50 can be deformed. The depressions 162 may be formed in any other portions of the pressurizing jig 160 unless they overlap the first regions 48. For example, the example of FIG. 25 includes further depressions 162 formed therein at positions between the first regions 48 that are arranged in the direction of width of the interconnect substrate 40. Thus, any part (or a portion of the base film 16) above a portion of the interconnect substrate 40 adjacent to a first region 48 in the direction of width of the interconnect substrate 40 (or a portion of the base 42) can also be deformed. The depressions 162 may be arranged in a grid as shown in FIG. 25.

As shown in FIG. 23, the pressurizing jig 160 pressurizes the adhesive material 154 against the interconnect substrate 40 placed on the stand 170. Since the stand 170 includes the depressions 172 as described, the second regions 50 in the base 42 are deformed to enter the depressions 172. Thus, the adhesive material 154 flows toward the second regions 50 to move the air bubbles 54 toward the second regions 50.

Since the pressurizing jig 160 includes the depressions 162 as described, part of the base film 16 above the second regions 50 is deformed to enter the depressions 162. Similarly, the adhesive material 154 flows toward the second regions 50 to move the air bubbles 54 to the second regions 50.

If the depressions 162 and 172 are also located between the first regions 48 arranged in the direction of width of the base 42, the adhesive material 154 can also flow toward these depressions 162, 172 together with the air bubbles 54. The other functions and advantages of the ninth embodiment are similar to those of the first embodiment.

Although both the pressurizing jig 160 and stand 170 are effectively utilized, any one of these members may only be used. Spaces may be formed in the adhesive material 154. At least one of the pressurizing jig 160 and the stand 170 described in connection with the ninth embodiment may be used in the other embodiments.

Tenth Embodiment

Figure 26:
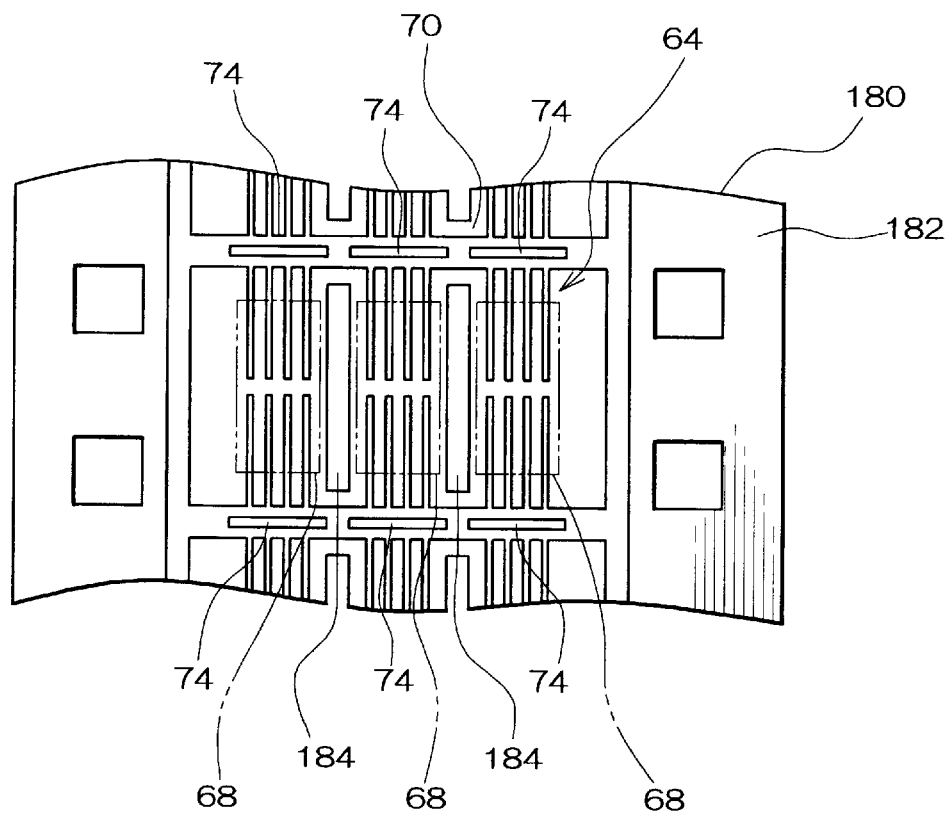
FIG. 26 illustrates a tenth embodiment of the present invention.

FIG. 26 shows the tenth embodiment of the present invention which uses an interconnect substrate 180 similar to the interconnect substrate 60 described in connection with the second embodiment (see FIG. 6), except that it comprises a base 182 including through-holes 184 formed therethrough. Therefore, similar parts will be designated by similar reference numerals.

The through-holes 184 are formed between the first regions 68 which are arranged in the direction of width of the base 182. Consequently, the adhesive material 154 described in connection with the ninth embodiment (see FIG. 22) can be used to flow the adhesive material 154 in the direction of width of the base 182 together with the air bubbles 54. The other functions and advantages of the tenth embodiment are similar to those of the first embodiment. The interconnect substrate 180 described in connection with the tenth embodiment may be used in the other embodiments.

Eleventh Embodiment

Figure 27:
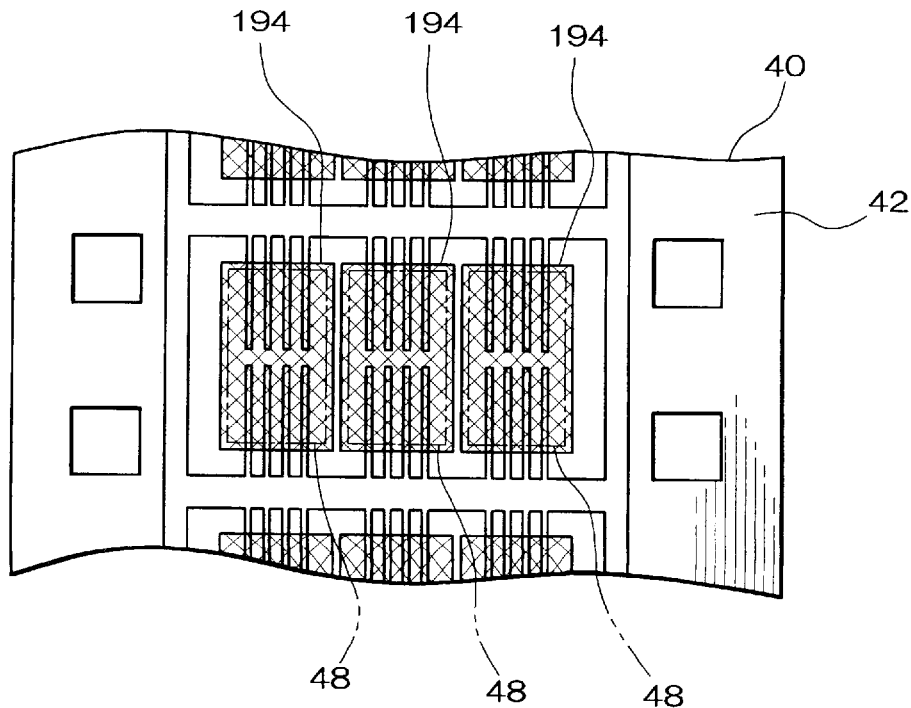
FIG. 27 illustrates an eleventh embodiment of the present invention.

FIG. 27 shows the eleventh embodiment of the present invention which uses individual adhesive material 194 independently on the respective first regions 48 of the interconnect substrate 40. The other functions and advantages of the eleventh embodiment are similar to those of the first embodiment. The present invention will not eliminate such a form.

Twelfth Embodiment

Figure 28:
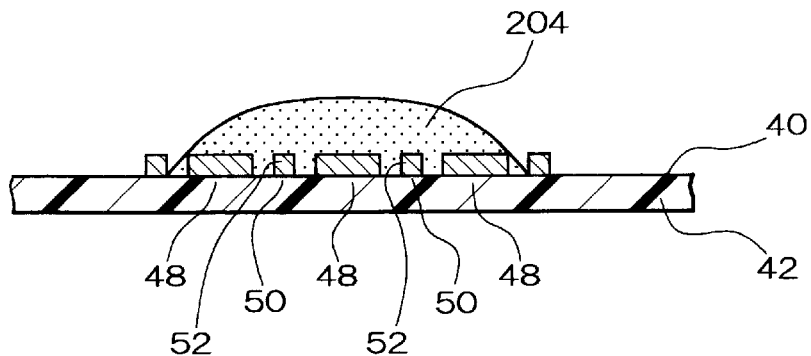
FIG. 28 illustrates a twelfth embodiment of the present invention.
Figure 29:
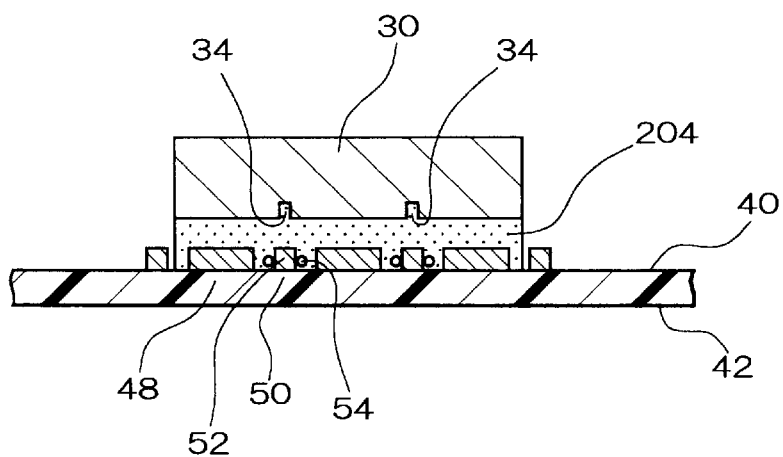
FIG. 29 illustrates a twelfth embodiment of the present invention.

FIGS. 28 and 29 show the twelfth embodiment of the present invention which uses a liquid adhesive material 204 on the interconnect substrate 40. The adhesive material 204 is similar to the adhesive material 14 described in connection with the first embodiment, except that it is liquid. The adhesive material 204 is to be applied to the interconnect substrate 40 by the pressurizing jig 30. The other functions and advantages of the twelfth embodiment are similar to those of the first embodiment. The present invention will not eliminate such a form.

Thirteenth Embodiment

Figure 30:
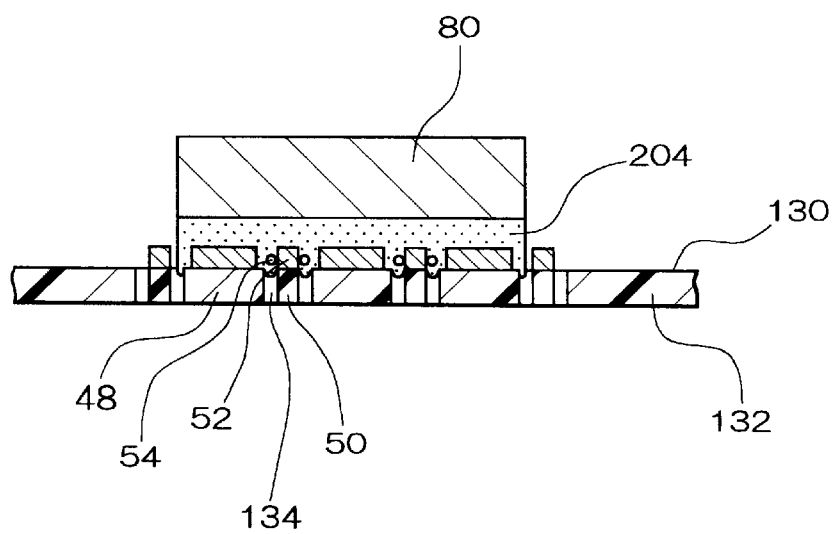
FIG. 30 illustrates a thirteenth embodiment of the present invention.

FIG. 30 shows the thirteenth embodiment of the present invention which uses a liquid adhesive material 204 applied to the interconnect substrate 130 described in connection with the seventh embodiment (see FIG. 16). The adhesive material 204 is similar to the adhesive material 14 described in connection with the first embodiment, except that it is liquid. The adhesive material 204 is t o be applied to the interconnect substrate 130 by using the pressurizing jig 80 described in connection with the seventh embodiment (see FIG. 18). The other functions and advantages of the thirteenth embodiment are similar to those of the seventh embodiment. The present invention will not eliminate such a form.

Fourteenth Embodiment

FIGS. 31–34 show the fourteenth embodiment of the present invention which comprises a step of applying a adhesive material to an interconnect substrate according to any one of the aforementioned processes. For example, the adhesive material 14 may be applied to the interconnect substrate 40 according to the first embodiment.

Figure 31:
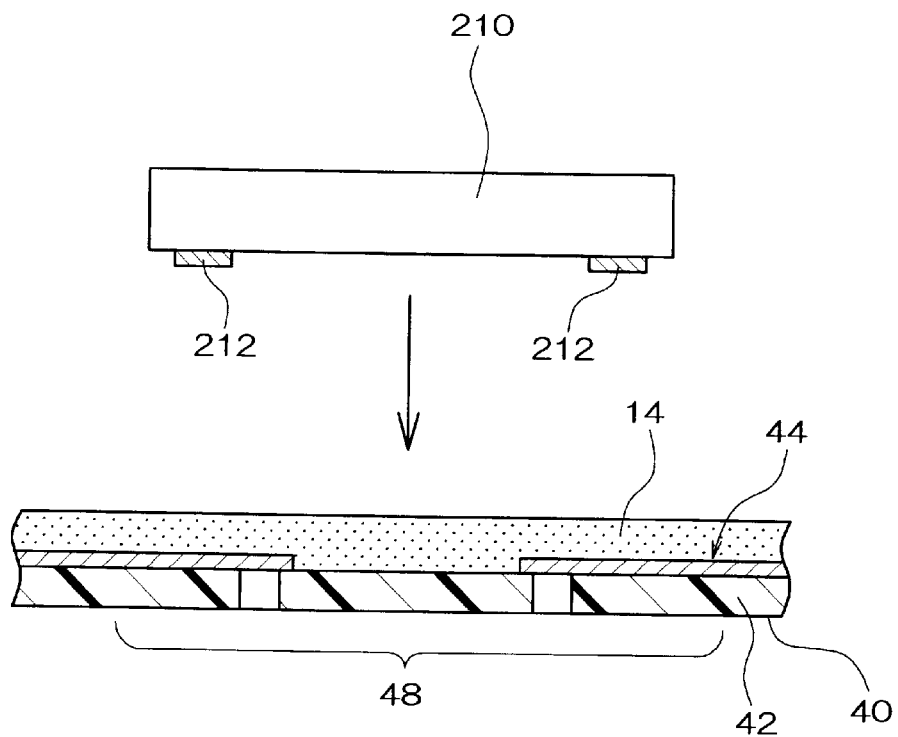
FIG. 31 illustrates a fourteenth embodiment of the present invention.
Figure 32:
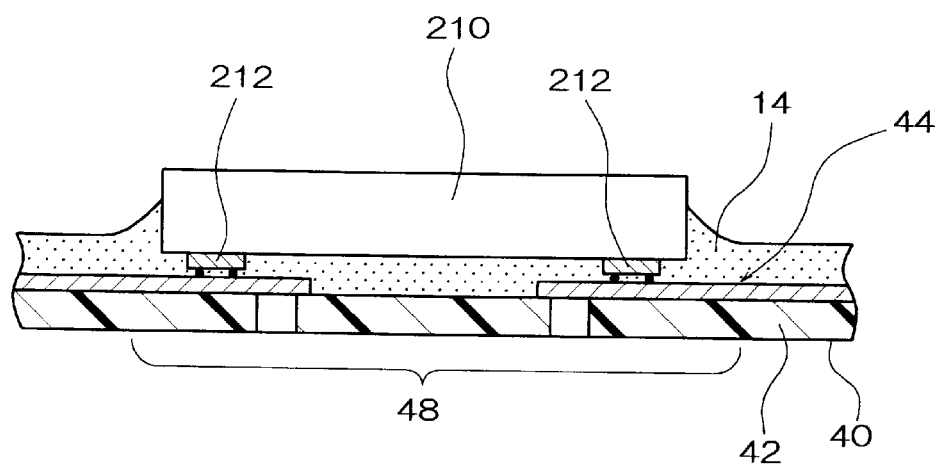
FIG. 32 illustrates a fourteenth embodiment of the present invention.

As shown in FIGS. 31–32, a semiconductor chip 210 is mounted on the interconnect substrate 40 through the adhesive material 14. More particularly, the semiconductor chip 210 is adhered over the first regions 48 of the interconnect substrate 40.

The planar configuration of the semiconductor chip 210 is generally rectangular. A plurality of electrodes 212 are provided on one surface of the semiconductor chip 210. The electrodes 212 are arranged along one side edge (or two or four side edges in many cases) on the semiconductor chip 210. Alternatively, the electrodes 212 may be arranged along the opposite edges of the semiconductor chip 210 or on the central portion of the same. Each of the electrodes 212 frequently comprises a flat and thin pad of aluminum or the like and a bump formed on the pad. If there is no bump, the electrode 212 will be formed only by the pad. The semiconductor chip 210 further comprises a passivation film (not shown) formed thereon not to overlap at least some of the electrodes 212. The passivation film may be formed of $SiO_2$, SiN, polyimide resin or the like.

In the example of FIG. 32, the adhesive material 14 is in the form of an anisotropic conductive film, but may be formed from such a material as described in connection with the first embodiment. For example, the adhesive material 14 may be any of liquid adhesive, gel-like adhesive and adhesive sheet. The adhesive material 14 may contain epoxy resin as a chief component. The adhesive material 14 may be insulative.

In order to improve the electrical connection, the adhesive material 14 may contain a conductive material. The conductive material may include particles of brazing or soldering material which are dispersed in the adhesive material. Thus, the electrical connection can be more effectively improved under the action of these particles.

The adhesive material 14 may be located at least over the first regions 48 to be adhered, but may extend outward from the first regions. In the latter, the portions surrounding the connections can mechanically be protected by the adhesive material 14.

At least the regions of the interconnect substrate 40 which is covered with the adhesive material 14 may be roughened. In other word, the interconnect substrate 40 may have its roughened surface. The roughening of the substrate surface can be attained by a mechanical means such as sandblasting, by a physical means such as plasma, ultra-violet rays or ozone or by a chemical means such as etching. Thus, the contact region between the substrate 40 and the adhesive material 14 can be increased or the physical or chemical adhering force therebetween can be increased. This provides a stronger connection.

The interconnect pattern 44 may be bonded directly to the electrodes 212 by using the shrinkage in the insulative adhesive material while at the same time, the substrate 40 is adhered to the semiconductor chip 210 through the adhesive material 14. Even in such a case, it is preferred that conductive projections (or bumps) are formed on any one of the electrode 212 and interconnect pattern 44.

The electrical connection between the interconnect pattern 44 and the electrodes 212 may be accomplished through a metal bonding technique using Au—Au, Au—Sn or solder. The metal bonding is carried out at contact regions between the interconnect pattern 44 and the electrodes 212. For example, the contact portions between the interconnect pattern 44 and the electrodes 212 may be bonded by applying only heat, only ultrasonic or both. After bonded, the materials forming the interconnect pattern and electrodes 44, 212 are diffused to form metal bonding under the action of vibration and/or heat.

Figure 33:
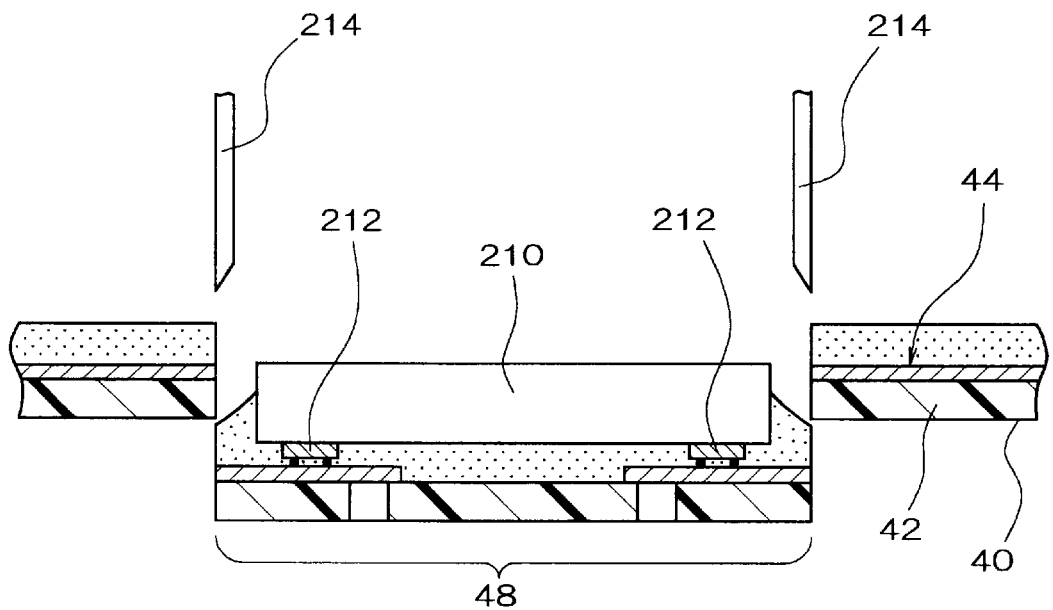
FIG. 33 illustrates a fourteenth embodiment of the present invention.

Subsequently, the interconnect substrate 40 is punched out at the first regions 48, as shown in FIG. 33. This is accomplished by using a cutting jig 214 such as cutter or punch.

Figure 34:
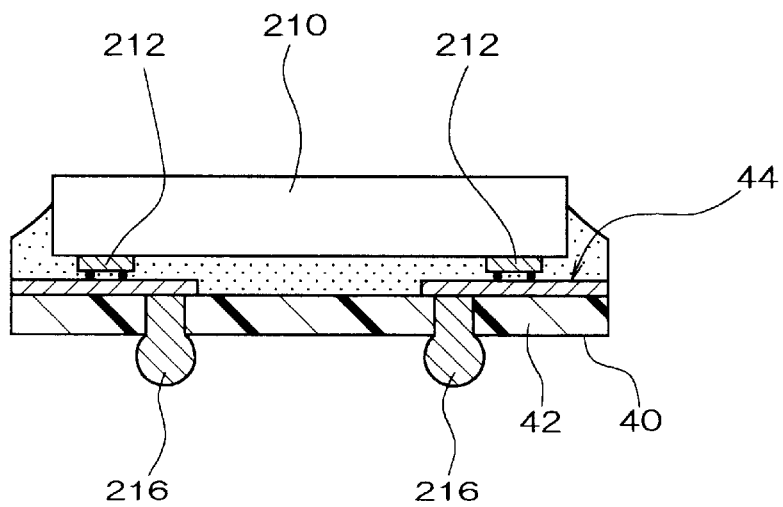
FIG. 34 illustrates a fourteenth embodiment of the present invention.

If desired, external terminals 216 may be provided as shown in FIG. 34. For example, each of the external terminals 216 may be formed to electrically connect with the interconnect pattern 44 through through-holes formed in the base 42. The external terminals 216 can be formed of solder or metal, but may be formed of any suitable conductive material. In the fourteenth embodiment, the external terminals 216 are in the form of solder balls. The solder balls may be formed by piling cream solder up in the through-holes and melting it during the reflow process. If the adhesive material 14 is thermally settable, the reflow process may heat the adhesive material 14 at the same time as the solder balls are formed, without any particular heating step. At the same time, other passive parts to be mounted on the substrate 40 may be soldered. Alternatively, the external terminals 216 may be provided by placing the solder in the through-holes or plating the conductive material to form solder balls.

Through the aforementioned process, a semiconductor device can be produced as shown in FIG. 34. Although FIG. 34 shows a FAN-IN type semiconductor device in which the external terminals 216 are located only within the range of the semiconductor chip 210, the present invention is not limited to such a form. For example, the present invention may similarly be applied to any other forms, such as a FAN-OUT type semiconductor device in which the external terminals 216 are located only outside the range of the semiconductor chip 210 or a combined FAN-IN/OUT type semiconductor device.

The solder balls are not necessarily required in the present invention. The extensions of the substrate 40 may be used as connectors. The interconnect pattern 44 may externally be expanded by using any other suitable means such as connectors or the like. Alternatively, the semiconductor chip 210 and associated components may be mounted on the substrate 40 to form a semiconductor module.

Furthermore, electrical connections may be formed under the action of surface tension of a molten solder cream which has been applied to a motherboard, without formation of any solder ball. At this time, the resulting semiconductor device is of a so-called land grid array (LGA) type.

The bonding between the electrodes 212 of the semiconductor chip 210 and the interconnect pattern 44 is not limited to the face-down bonding as described above. For example, the face-up bonding according to the wire-bonding method may be used.

The package form may be of any of a group including ball grid array (BGA) such as tape ball grid array (T-BGA), land grid array (LGA), chip size/scale package (CSP) including tape chip size/scale package (T-CSP) and tape carrier package (TCP). The mounting form may be either of chip on film (COF) or chip on glass (CPG).

Other Embodiments

Figure 35:
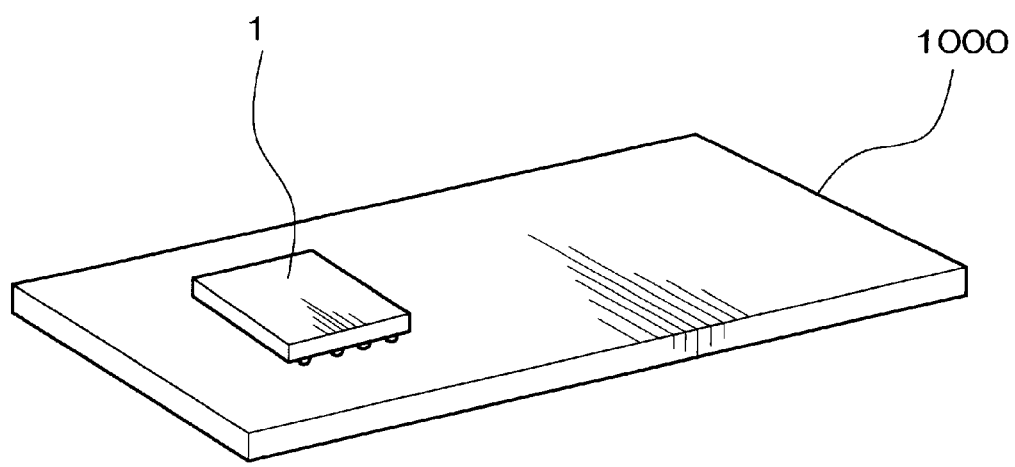
FIG. 35 illustrates a circuit board on which a semiconductor device according to the present invention is mounted.

FIG. 35 shows a circuit board 1000 on which a semiconductor device 1 is mounted. The circuit board 1000 is generally an organic board such as glass-epoxy board or the like. The circuit board 1000 may include an interconnect pattern of copper or the like to provide a desired circuitry. The interconnect pattern can mechanically and electrically be connected to the external terminals of the semiconductor device 1.

Figure 36:
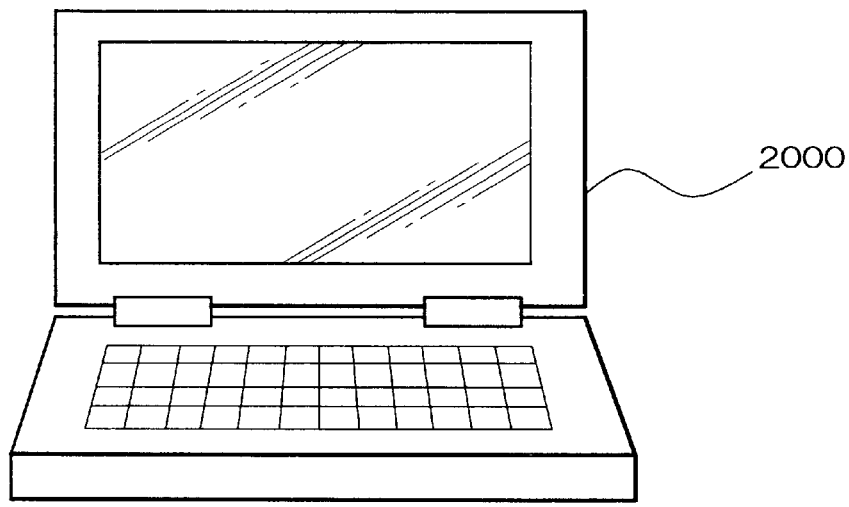
FIG. 36 illustrates an electronic instrument having a semiconductor device according to the present invention.
Figure 37:
FIG. 37 illustrates an electronic instrument having a semiconductor device according to the present invention.

As an electronic instrument having a semiconductor device 1 to which the present invention is applied, FIG. 36 shows a notebook personal computer 2000. FIG. 37 shows a portable telephone 3000 as another electronic instrument.

It should be noted that the above-described "semiconductor chip" of the present invention may be replaced by "electronic element," and an electronic component can be manufactured by mounting an electronic element (whether an active element or a passive element) on the substrate in the same way as a semiconductor chip. As electronic components manufactured using such an electronic element may be cited, for example, optical elements, resistors, capacitors, coils, oscillators, filters, temperature sensors, thermistors, varistors, variable resistors, and fuses. A plurality of semiconductor chips may be mounted.

What is claimed is:

1. A method of applying an adhesive material, comprising the steps of:

providing an adhesive material on an interconnect substrate which has a base and an interconnect pattern formed on the base; and pressure-bonding the adhesive material onto the interconnect substrate, wherein the base has a plurality of first regions to be punched out and second regions located between the first regions adjacent to one another;

wherein the interconnect pattern is formed at least in the first regions of the base; and wherein part of the adhesive material provided in the first regions is pressurized to flow toward the second regions, so that air bubbles formed at corners between the base and the interconnect pattern in the first regions are moved to the second regions.

2. The method of applying an adhesive material as defined in claim 1, wherein through-holes are formed in the second regions of the base of the interconnect substrate; and wherein the adhesive material is pressurized to flow into the through-holes.

3. The method of applying an adhesive material as defined in claim 2, wherein the interconnect pattern includes leads formed in the second regions; and wherein the through-holes penetrate the leads and the base.

4. The method of applying an adhesive material as defined in claim 2, wherein the interconnect pattern includes leads formed in the second regions; and wherein the through-holes are formed adjacent to the leads.

5. The method of applying an adhesive material as defined in claim 1, wherein the interconnect substrate includes depressions formed within the second regions on a surface of the base opposite to another surface of the base on which the interconnect pattern is formed; and wherein the surface having the interconnect pattern is dented toward the depressions so that the adhesive material flows when the adhesive material is pressurized.

6. The method of applying an adhesive material as defined in claim 5, wherein the interconnect pattern includes leads formed in the second regions; and wherein the depressions are formed below the leads.

7. The method of applying an adhesive material as defined in claim 1, wherein a pressurizing jig is used to pressure-bond the adhesive material onto the interconnect substrate;

wherein the pressurizing jig is formed with depressions at positions corresponding to the second regions of the base; and wherein the adhesive material is pressurized to flow toward the depressions.

8. The method of applying an adhesive material as defined in claim 1, wherein the interconnect substrate is placed on a stand so that the adhesive material is pressure-bonded to the interconnect pattern;

wherein the stand has depressions at positions corresponding to the second regions of the base; and wherein when the adhesive material is pressurized, the surface of the base on which the interconnect pattern is formed is dented toward the depressions so that the adhesive material flows.

9. The method of applying an adhesive material as defined in claim 1, wherein spaces are formed in the adhesive material at positions above the second regions of the base so that the adhesive material flows into the spaces later.

10. The method of applying an adhesive material as defined in claim 9, wherein the interconnect pattern includes leads formed in the second regions; and wherein the magnitude of each of the spaces is larger than each of the leads.

11. The method of applying an adhesive material as defined in claim 1, wherein the first regions are arranged in plural rows and columns.

12. The method of applying an adhesive material as defined in claim 1, wherein the adhesive material is provided in a form of a film to be pressure-bonded to the interconnect substrate.

13. The method of applying an adhesive material as defined in claim 1, wherein the adhesive material is provided in a form of a liquid to be pressure-bonded to the interconnect substrate.

14. A method of manufacturing a semiconductor device, comprising the steps of:

applying the adhesive material to the interconnect substrate by the method of applying an adhesive material as defined in claim 1;

bonding semiconductor chips to the respective first regions through the adhesive material; and punching out the interconnect substrate at each of the first regions.

* * * * *